United States Patent
Handa et al.

(10) Patent No.: US 12,527,023 B2
(45) Date of Patent: Jan. 13, 2026

(54) NITRIDE SEMICONDUCTOR DEVICE

(71) Applicant: Panasonic Holdings Corporation, Osaka (JP)

(72) Inventors: Hiroyuki Handa, Osaka (JP); Daisuke Shibata, Kyoto (JP); Satoshi Tamura, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 324 days.

(21) Appl. No.: 18/450,233

(22) Filed: Aug. 15, 2023

(65) Prior Publication Data

US 2023/0387288 A1    Nov. 30, 2023

Related U.S. Application Data

(63) Continuation of application No. PCT/JP2022/000937, filed on Jan. 13, 2022.

(30) Foreign Application Priority Data

Feb. 24, 2021    (JP) ................................. 2021-027984

(51) Int. Cl.
  *H10D 30/47* (2025.01)
  *H10D 62/10* (2025.01)
  *H10D 62/85* (2025.01)

(52) U.S. Cl.
  CPC ......... *H10D 30/477* (2025.01); *H10D 30/478* (2025.01); *H10D 62/102* (2025.01); *H10D 62/8503* (2025.01)

(58) Field of Classification Search
  None
  See application file for complete search history.

(56) References Cited

U.S. PATENT DOCUMENTS

2008/0128862 A1   6/2008 Sugimoto et al.
2009/0315037 A1*  12/2009 Kikkawa .............. H10D 62/115
                                                    438/192
(Continued)

FOREIGN PATENT DOCUMENTS

CN   110875372 A   3/2020
JP   2006-140368 A  6/2006
(Continued)

OTHER PUBLICATIONS

International Search Report issued on Mar. 22, 2022 in International Patent Application No. PCT/JP2022/000937, with English translation.

(Continued)

*Primary Examiner* — Khaja Ahmad
(74) *Attorney, Agent, or Firm* — Rimon P.C.

(57) ABSTRACT

A nitride semiconductor device includes: a substrate; a first nitride semiconductor layer of a first conductivity type which is provided above the substrate; a second nitride semiconductor layer which is provided above the first nitride semiconductor layer; an electron transport layer and an electron supply layer which are sequentially provided above the second nitride semiconductor layer; a third nitride semiconductor layer and a gate electrode which are sequentially provided above the electron supply layer; a source electrode; and a drain electrode, the second nitride semiconductor layer includes: a current conducting portion of the first conductivity type which is located below the third nitride semiconductor layer and includes a first impurity; and a current blocking portion which is provided about the current conducting portion, and the concentration of the first impurity in the electron transport layer is lower than the concentration of the first impurity in the current conducting portion.

20 Claims, 22 Drawing Sheets

(56) References Cited

U.S. PATENT DOCUMENTS

| | | | |
|---|---|---|---|
| 2011/0193096 A1* | 8/2011 | Imada | H10D 62/357 977/890 |
| 2012/0319127 A1* | 12/2012 | Chowdhury | H10D 30/4755 257/E29.089 |
| 2013/0062666 A1* | 3/2013 | Imada | H10D 62/106 257/E29.05 |
| 2016/0284563 A1 | 9/2016 | Niwa et al. | |
| 2016/0329421 A1 | 11/2016 | Shibata et al. | |
| 2019/0115215 A1 | 4/2019 | Takashima et al. | |
| 2020/0119178 A1 | 4/2020 | Okita et al. | |
| 2021/0151578 A1* | 5/2021 | Cao | H10D 64/519 |

FOREIGN PATENT DOCUMENTS

| | | |
|---|---|---|
| JP | 2007-173705 A | 7/2007 |
| JP | 2009-094337 A | 4/2009 |
| JP | 2009-283692 A | 12/2009 |
| JP | 2014-520405 A | 8/2014 |
| JP | 6327378 B1 | 5/2018 |
| JP | 6330705 B2 | 5/2018 |
| JP | 6402746 B2 | 10/2018 |
| JP | 6511645 B2 | 5/2019 |
| WO | 2008/105077 A1 | 9/2008 |
| WO | 2012/177699 A1 | 12/2012 |
| WO | 2018/230136 A1 | 12/2018 |

OTHER PUBLICATIONS

Hui Nie, et al., "1.5-kV and 2.2-mΩ-cm2 Vertical GaN Transistors on Bulk-GaN Substrates", IEEE Electron Device Letters, vol. 35, No. 9, Sep. 2014, pp. 939-941.

Srabanti Chowdhury, et al., "Enhancement and Depletion Mode AlGaN/GaN CAVET With Mg-Ion-Implanted GaN as Current Blocking Layer", IEEE Electron Device Letters, vol. 29, No. 6, Jun. 2008, pp. 543-545.

* cited by examiner

NITRIDE SEMICONDUCTOR DEVICE

CROSS REFERENCE TO RELATED APPLICATIONS

This is a continuation application of PCT International Application No. PCT/JP2022/000937 filed on Jan. 13, 2022, designating the United States of America, which is based on and claims priority of Japanese Patent Application No. 2021-027984 filed on Feb. 24, 2021. The entire disclosures of the above-identified applications, including the specifications, drawings and claims are incorporated herein by reference in their entirety.

FIELD

The present disclosure relates to nitride semiconductor devices.

BACKGROUND

Nitride semiconductors such as gallium nitride (GaN) are widegap semiconductors with a large band gap, have a high dielectric breakdown electric field strength, and have a higher saturated drift velocity of electrons than gallium arsenide (GaAs) semiconductors or silicon (Si) semiconductors. Hence, research and development of power transistors using nitride semiconductors which are advantageous for high output and high voltage resistance are conducted.

For example, Patent Literature (PTL) 1 discloses a vertical field effect transistor (FET) including: a regrown layer which is located to cover an opening provided in a GaN-based multilayer; and a gate electrode which is located on the regrown layer along the regrown layer. A channel is formed by a 2-dimensional electron gas (2DEG) generated in the regrown layer.

CITATION LIST

Patent Literature

PTL 1: Japanese Patent No. 6511645
PTL 2: Japanese Unexamined Patent Application Publication (Translation of PCT Application) No. 2014-520405

SUMMARY

Technical Problem

There is room for improvement in the electrical properties of the conventional field effect transistor described above.

Hence, the present disclosure provides a nitride semiconductor device in which electrical properties are improved.

Solution to Problem

A nitride semiconductor device according to an aspect of the present disclosure includes: a substrate; a first nitride semiconductor layer of a first conductivity type which is provided above the substrate; a second nitride semiconductor layer which is provided above the first nitride semiconductor layer; an electron transport layer and an electron supply layer which are sequentially provided above the second nitride semiconductor layer; a third nitride semiconductor layer of a second conductivity type and a gate electrode which are sequentially provided above the electron supply layer; a source electrode which has at least a portion provided on the electron supply layer; and a drain electrode which is provided on a side of the substrate opposite to a side on which the first nitride semiconductor layer is provided, the second nitride semiconductor layer includes: a current conducting portion of the first conductivity type which is located below the third nitride semiconductor layer and includes a first impurity; and a current blocking portion which is provided about the current conducting portion, and a concentration of the first impurity in the electron transport layer is lower than a concentration of the first impurity in the current conducting portion.

Advantageous Effects

According to the present disclosure, it is possible to provide a nitride semiconductor device in which electrical properties are improved.

BRIEF DESCRIPTION OF DRAWINGS

These and other advantages and features will become apparent from the following description thereof taken in conjunction with the accompanying Drawings, by way of non-limiting examples of embodiments disclosed herein.

Figure 1:
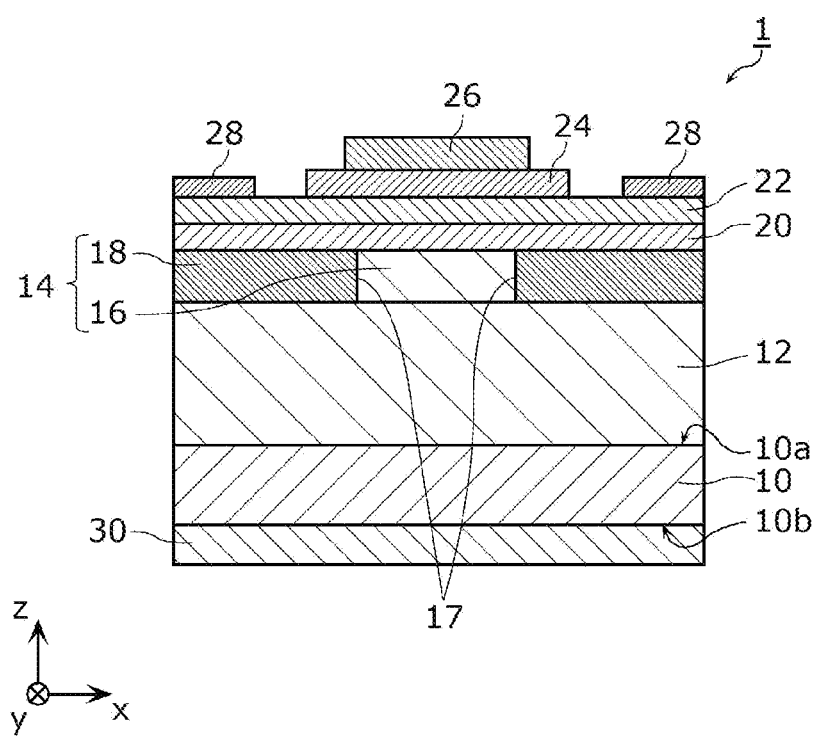
FIG. 1 is a cross-sectional view of a nitride semiconductor device according to Embodiment 1.

DESCRIPTION OF EMBODIMENTS (Underlying Knowledge Forming Basis of the Present Disclosure)

The present inventors have found that the following problems occur in the conventional FET described in "Background".

In the FET disclosed in PTL 1, crystal defects are formed when a nitride semiconductor layer is regrown along the inner surface of a gate opening. The crystal defects appear as pits in the surface of the regrown layer. When a gate electrode is formed on the surface of the regrown layer in which the pits occur, the gate electrode makes Schottky contact through the pits, and thus yields may deteriorate in the forward direction characteristic of the FET.

On the other hand, a nitride semiconductor device according to an aspect of the present disclosure includes: a substrate; a first nitride semiconductor layer of a first conductivity type which is provided above the substrate; a second nitride semiconductor layer which is provided above the first nitride semiconductor layer; an electron transport layer and an electron supply layer which are sequentially provided above the second nitride semiconductor layer; a third nitride semiconductor layer of a second conductivity type and a gate electrode which are sequentially provided above the electron supply layer; a source electrode which has at least a portion provided on the electron supply layer; and a drain electrode which is provided on a side of the substrate opposite to a side on which the first nitride semiconductor layer is provided, the second nitride semiconductor layer includes: a current conducting portion of the first conductivity type which is located below the third nitride semiconductor layer and includes a first impurity; and a current blocking portion which is provided about the current conducting portion, and a concentration of the first impurity in the electron transport layer is lower than a concentration of the first impurity in the current conducting portion.

In this way, the upper surface of the second nitride semiconductor layer can be flattened, and thus crystal defects generated in the electron transport layer and the electron supply layer formed by regrowth are suppressed. Hence, pits which are caused by crystal defects are unlikely to be generated in the upper surface of the electron supply layer. Therefore, Schottky contact of the gate electrode is suppressed, and thus it is possible to suppress the deterioration of yields in the forward direction characteristic of the FET. The impurity concentration of the electron transport layer including a channel is lowered, and thus the pinch-off characteristic of the FET is enhanced. As described above, in the present aspect, the nitride semiconductor device in which electrical properties are improved is realized.

For example, the first impurity may be silicon (Si).

In this way, the current conducting portion and the first nitride semiconductor layer of the n type are formed, and thus low resistance can be achieved, with the result that it is possible to reduce the on resistance.

For example, the nitride semiconductor device according to the aspect of the present embodiment may further include: an opening which penetrates through the electron supply layer and the electron transport layer to reach the current blocking portion, and the source electrode may be provided along an inner surface of the opening.

In this way, the current blocking portion and the source electrode can be electrically connected, and thus an electric field which is applied to the channel in the electron transport layer can be relaxed. Hence, it is possible to suppress the development of current collapse.

For example, the nitride semiconductor device according to the aspect of the present embodiment may further include: a fourth nitride semiconductor layer which is provided between the second nitride semiconductor layer and the first nitride semiconductor layer and is doped with carbon.

In this way, the resistance of the fourth nitride semiconductor layer doped with carbon is high, and thus it is possible to reduce a leakage current when the nitride semiconductor device is off, with the result that the voltage resistance of the transistor can be enhanced.

For example, the fourth nitride semiconductor layer may be provided in a region that overlaps only the current blocking portion out of the current conducting portion and the current blocking portion in plan view.

In this way, the fourth nitride semiconductor layer is not provided in the path of a drain current, and thus it is possible to reduce the leakage current when the nitride semiconductor device is off while suppressing a decrease in the on resistance, with the result that the voltage resistance of the transistor can be enhanced.

For example, the current blocking portion may include a second impurity different from the first impurity, a concentration of the second impurity in the current blocking portion may be distributed such that a peak is present in a thickness direction of the second nitride semiconductor layer, and the concentration of the first impurity in the current conducting portion may be uniform in the thickness direction.

In this way, there is no imbalance in the impurity concentration in the current conducting portion, and thus variations in electrical resistance and the like are suppressed.

Hence, the highly reliable nitride semiconductor device in which variations in the on resistance in the surface are decreased is realized. The current blocking portion can be formed in only a necessary region, for example, by ion implantation or the like.

For example, the current blocking portion may include a second impurity different from the first impurity, the concentration of the first impurity in the current conducting portion may be distributed such that a peak is present in a thickness direction of the second nitride semiconductor layer, and a concentration of the second impurity in the current blocking portion may be uniform in the thickness direction.

In this way, the current conducting portion can be formed in only a necessary region, for example, by ion implantation or the like.

For example, the second impurity may be magnesium (Mg).

In this way, the current blocking portion of the p type is formed, and thus it is possible to block a current flowing through the first nitride semiconductor layer of the n type.

For example, the electron supply layer may include a recess which is provided above the current conducting portion and below the third nitride semiconductor layer.

In this way, the thickness of the electron supply layer can be partially increased, and thus the carrier concentration of 2DEG generated in the electron transport layer can be increased. Hence, the resistance of the channel can be reduced, and thus it is possible to reduce the on resistance.

For example, the nitride semiconductor device according to the aspect of the present embodiment may further include: a current diffusion layer which is provided between the first nitride semiconductor layer and the second nitride semiconductor layer and has a higher carrier concentration of the first conductivity type than the first nitride semiconductor layer.

In this way, a current can be diffused in a lateral direction, and thus it is possible to reduce the on resistance.

For example, an interface between the current conducting portion and the current blocking portion may be perpendicular to a main surface of the substrate.

In this way, the interface between the current conducting portion and the current blocking portion is perpendicular, and thus for example, a plurality of current conducting portions can be arranged highly accurately.

For example, the current conducting portion may be surrounded by the current blocking portion in plan view.

In this way, it is possible to decrease the size of a region in which the gate electrode and the drain electrode are opposite each other without the intervention of the current blocking portion. In other words, an opposite area between the gate and the drain is decreased, and thus the feedback capacitance of the FET can be reduced.

For example, the nitride semiconductor device may include a plurality of current conducting portions each being the current conducting portion, and the plurality of current conducting portions may be arranged at regular intervals in plan view.

In this way, it is possible to decrease the size of the region in which the gate electrode and the drain electrode are opposite each other without the intervention of the current blocking portion, and thus the feedback capacitance of the FET can be reduced.

For example, the nitride semiconductor device may include a plurality of source electrodes each being the source electrode, the plurality of current conducting portions may be arranged at regular intervals along a first direction and a second direction orthogonal to the first direction in plan view, each of the plurality of source electrodes may be in an elongated shape extending in the second direction in plan view, and may be sandwiched between two current conduction portions aligned in the first direction, the two current conduction portions being included in the plurality of current conducting portions, and the gate electrode may be continuous to surround the plurality of source electrodes.

In this way, for example, drawing wiring extending in the second direction is used, and thus the source electrodes and the source electrode pad can be connected. In this case, the overlap of the source electrodes and the gate pad can be reduced, and thus it is possible to suppress the occurrence of destruction of the FET caused by a short circuit between the gate and the source.

For example, the nitride semiconductor device may include a plurality of source electrodes each being the source electrode, the plurality of current conducting portions may be arranged on sides of a plurality of virtual hexagons filled in a plane in plan view, the plurality of source electrodes may be individually arranged in center portions of the plurality of virtual hexagons, and the gate electrode may be continuous to surround the plurality of source electrodes.

In this way, the nitride semiconductor device can have a closest-packed structure, and thus it is possible to sufficiently lower the on resistance per unit area.

For example, the nitride semiconductor device according to the aspect of the present embodiment may further include: a gate electrode pad which is located above the gate electrode and is electrically connected to the gate electrode, and the gate electrode pad may be located at an end portion in a third direction and may be located in a center portion in a fourth direction orthogonal to the third direction in plan view.

In this way, the gate electrode pad is located in the center portion in the fourth direction, and thus it is possible to uniformly apply a gate voltage to the gate electrode in the fourth direction. Since the gate electrode pad is located at the end portion in the third direction, when the gate electrode pad and the source electrode pad are connected to a mounting substrate or the like by wire bonding, the occurrence of wire crossing can be prevented.

For example, the nitride semiconductor device according to the aspect of the present embodiment may further include: a gate electrode pad which is located above the gate electrode and is electrically connected to the gate electrode, and the gate electrode pad may be located in a center portion in a third direction and may be located in a center portion in a fourth direction orthogonal to the third direction in plan view.

In this way, the gate electrode pad is located in the center portion in the surface, and thus it is possible to uniformly apply the gate voltage to the gate electrode.

For example, the nitride semiconductor device according to the aspect of the present embodiment may further include: one or more nitride semiconductor regions of the second conductivity type which are ring-shaped and are arranged to surround the current blocking portion in plan view.

In this way, electric field concentration can be relaxed by the ring-shaped nitride semiconductor regions (so-called guard rings) provided at termination portions of the nitride semiconductor device.

For example, each of the one or more nitride semiconductor regions may include a third impurity, and a concentration of the third impurity in the nitride semiconductor region may be distributed such that a peak is present in a thickness direction of the second nitride semiconductor layer.

In this way, it is possible to form the guard rings, for example, by ion implantation.

For example, each of the one or more nitride semiconductor regions may include a third impurity, and a concentration of the third impurity in the nitride semiconductor region may be uniform in a thickness direction of the second nitride semiconductor layer.

In this way, it is possible to form the guard rings, for example, by epitaxial growth.

A method for manufacturing a nitride semiconductor device according to an aspect of the present disclosure includes: a first step of forming a first nitride semiconductor layer of a first conductivity type above a substrate; a second step of forming a second nitride semiconductor layer above the first nitride semiconductor layer; a third step of forming an electron transport layer and an electron supply layer in this order above the second nitride semiconductor layer; a fourth step of forming a third nitride semiconductor layer of a second conductivity type above the electron supply layer; a fifth step of forming a gate electrode above the third nitride semiconductor layer; a sixth step of forming a source electrode on the electron supply layer; and a seventh step of forming a drain electrode on a side of the substrate opposite to a side on which the first nitride semiconductor layer is provided, and the second step includes a film formation step of forming a nitride semiconductor film and an implantation step of ion-implanting an impurity into only a portion of the nitride semiconductor film formed to form a current conducting portion of the first conductivity type or a current blocking portion.

In this way, the current blocking portion or the current conducting portion is formed by ion implantation, and thus the upper surface of the second nitride semiconductor layer can be maintained flat. The electron transport layer and the electron supply layer are sequentially formed above the second nitride semiconductor layer having the flat upper surface, and thus crystal defects are unlikely to be generated in the electron transport layer and the electron supply layer. Hence, pits generated in the front surface of the electron supply layer are suppressed, and thus Schottky contact of the gate electrode with the electron supply layer can be suppressed. Therefore, the deterioration of yields in the forward direction characteristic of the FET is suppressed, and thus it is possible to manufacture the nitride semiconductor device in which electrical properties are improved.

For example, the nitride semiconductor film may be a semiconductor film of the second conductivity type, the impurity may be an impurity of the first conductivity type, and in the implantation step, the impurity of the first conductivity type may be ion-implanted to form the current conducting portion.

In this way, it is possible to easily form the current conducting portion into a desired shape by ion implantation.

For example, the nitride semiconductor film may be a semiconductor film of the first conductivity type, the impurity may be an impurity of the second conductivity type, and in the implantation step, the impurity of the second conductivity type may be ion-implanted to form the current blocking portion.

In this way, it is possible to easily form the current conducting portion by epitaxial growth. There is no imbalance in the impurity concentration in the current conducting portion, and thus variations in electrical resistance and the like are suppressed. Hence, the highly reliable nitride semiconductor device in which variations in the on resistance in the surface are decreased can be manufactured.

Embodiments will be specifically described below with reference to drawings.

Each of the embodiments described below shows a comprehensive or specific example. Numerical values, shapes, materials, constituent elements, the arrangement and connection of the constituent elements, steps, the order of the steps, and the like shown in the following embodiments are examples, and are not intended to limit the present disclosure. Among the constituent elements in the following embodiments, constituent elements which are not recited in the independent claim are described as optional constituent elements.

The drawings are schematic views and are not exactly shown. Hence, for example, scales and the like are not necessarily the same in the drawings. In the drawings, substantially the same configurations are identified with the same reference signs, and repeated descriptions are omitted or simplified.

In the present specification, terms such as parallel and orthogonal which indicate relationships between elements, terms such as rectangular and trapezoid which indicate the shapes of elements, and numerical ranges are expressions which not only indicate exact meanings but also indicate substantially equivalent ranges such as a range including a several percent difference.

In the present specification and the drawings, an x-axis, a y-axis, and a z-axis indicate three axes of a three-dimensional orthogonal coordinate system. When the shape of a substrate in plan view is a rectangle, the x-axis and the y-axis respectively extend in a direction parallel to a first side of the rectangle and in a direction parallel to a second side orthogonal to the first side. The z-axis extends in the thickness direction of the substrate. In the present specification, the "thickness direction" of the substrate refers to a direction perpendicular to the main surface of the substrate. The thickness direction is the same as the stacking direction of semiconductor layers, and is also referred to as a "longitudinal direction". A direction parallel to the main surface of the substrate may be referred to as a "lateral direction".

The side (the positive side of the z-axis) on which a gate electrode and a source electrode are provided with respect to the substrate is regarded as being "upward" or an "upward side", and the side (the negative side of the z-axis) on which a drain electrode is provided with respect to the substrate is regarded as being "downward" or a "downward side".

In the present specification, terms of "upward" and "downward" do not indicate an upward direction (vertically upward) and a downward direction (vertically downward) in absolute spatial recognition but are used as terms for defining a relative positional relationship based on a stacking order in a stacking configuration. The terms of "upward" and "downward" are applied not only to a case where two constituent elements are spaced with another constituent element present between the two constituent elements but also to a case where two constituent elements are arranged in close contact with each other to be in contact with each other.

In the present specification, "in plan view" means that the main surface of the substrate of a nitride semiconductor device is viewed in a direction perpendicular to the main surface, that is, that the main surface of the substrate is viewed from the front.

In the present specification, unless otherwise specified, ordinal numbers such as "first" and "second" do not mean the number or order of constituent elements but are used to avoid confusion of similar constituent elements and to distinguish between them.

In the present specification, AlGaN indicates a ternary mixed crystal of $Al_xGa_{1-x}N$ (0<x<1). In the following description, multinary mixed crystals are abbreviated by the sequences of constituent element symbols such as AlInN and GaInN. For example, $Al_xGa_{1-x-y}In_yN$ (0<x<1, 0<y<1, and 0<x+y<1) which is an example of a nitride semiconductor is abbreviated as AlGaInN.

Embodiment 1

[Outline]

An outline of a nitride semiconductor device according to Embodiment 1 will first be described with reference to FIG. 1.

FIG. 1 is a cross-sectional view of nitride semiconductor device 1 according to the present embodiment. As shown in FIG. 1, nitride semiconductor device 1 includes substrate 10, drift layer 12, aperture structure layer 14, electron transport layer 20, electron supply layer 22, threshold adjustment layer 24, gate electrode 26, source electrode 28 and drain electrode 30. Aperture structure layer 14 includes current conducting portion 16 and current blocking portion 18.

Nitride semiconductor device 1 has a stacking structure of semiconductor layers which include, as main components, nitride semiconductors such as GaN and AlGaN. Specifically, nitride semiconductor device 1 has a heterostructure of an AlGaN film and a GaN film.

In the heterostructure of the AlGaN film and the GaN film, a high-concentration 2-dimensional electron gas (2DEG) is generated at a heterointerface by spontaneous polarization or piezoelectric polarization on a (0001) plane. Hence, even in an undoped state, a sheet carrier concentration of $1\times10^{13}$ $cm^{-3}$ or more can be obtained at the interface.

Nitride semiconductor device 1 according to the present embodiment is a field effect transistor (FET) which utilizes, as a channel, the 2DEG generated at the heterointerface of AlGaN/GaN. Specifically, nitride semiconductor device 1 is a so-called vertical FET.

Nitride semiconductor device 1 is a normally-off FET. In nitride semiconductor device 1, for example, source electrode 28 is grounded (that is, its potential is 0 V), and a positive potential is applied to drain electrode 30. Although the potential applied to drain electrode 30 is, for example, greater than or equal to 100 V and less than or equal to 1200 V, the potential is not limited to this range. When nitride semiconductor device 1 is off, 0 V or a negative potential (for example, −5 V) is applied to gate electrode 26. When nitride semiconductor device 1 is on, a positive potential (for example, +5 V) is applied to gate electrode 26.

[Configuration]

Constituent elements included in nitride semiconductor device 1 will be described in detail below.

Substrate 10 is a substrate of nitride semiconductors, and includes, as shown in FIG. 1, first main surface 10a and second main surface 10b which face away from each other. First main surface 10a is a main surface (upper surface) on the side on which drift layer 12 is formed. Specifically, first main surface 10a substantially coincides with a c-plane. Second main surface 10b is a main surface (lower surface) on the side on which drain electrode 30 is formed. Although the shape of substrate 10 in plan view is, for example, a rectangle, the shape is not limited to the rectangle.

Substrate 10 is, for example, a substrate of $n^+$ type GaN in which its thickness is 300 μm and its carrier concentration is $1\times10^{18}$ $cm^{-3}$. The n type and the p type each indicate the conductivity type of a semiconductor. The $n^+$ type indicates a state where a high-concentration n type dopant is added into a semiconductor, that is, a so-called heavily doped state. The $n^-$ type indicates a state where a low-concentration n type dopant is added into a semiconductor, that is, a so-called lightly doped state. The same is true for the $p^+$ type and the $p^-$ type. The n type, the $n^+$ type, and the $n^-$ type are examples of a first conductivity type. The p type, the $p^+$ type, and the $p^-$ type are examples of a second conductivity type. The second conductivity type is the opposite polarity conductivity type of the first conductivity type.

Substrate 10 does not need to be a substrate of a nitride semiconductor. For example, substrate 10 may be a silicon (Si) substrate, a silicon carbide (SiC) substrate, a zinc oxide (ZnO) substrate, a silicon carbide (SiC) thin film on a silicon (Si) substrate, a graphite substrate containing graphene, or the like.

Drift layer 12 is an example of a first nitride semiconductor layer of the first conductivity type which is disposed above substrate 10. For example, drift layer 12 is provided in contact with first main surface 10a of substrate 10.

Drift layer 12 is, for example, a film of $n^-$ type GaN which has a thickness of 8 μm. The donor concentration of drift layer 12 is, for example, in a range greater than or equal to $1\times10^{15}$ $cm^{-3}$ and less than or equal to $1\times10^{17}$ $cm^{-3}$, and an example of the donor concentration is $1\times10^{16}$ $cm^{-3}$. The carbon concentration (C concentration) of drift layer 12 is in a range greater than or equal to $1\times10^{15}$ $cm^{-3}$ and less than or equal to $2\times10^{17}$ $cm^{-3}$.

Aperture structure layer 14 is an example of a second nitride semiconductor layer which is provided above drift layer 12. As shown in FIG. 1, aperture structure layer 14 includes n type current conducting portion 16 and p type current blocking portion 18. Specific configuration of aperture structure layer 14 will be described later.

Electron transport layer 20 is provided above aperture structure layer 14. Specifically, electron transport layer 20 is provided on the upper surfaces of current conducting portion 16 and current blocking portion 18. For example, electron transport layer is a film of undoped GaN which has a thickness of 150 nm.

Electron transport layer 20 includes a channel region. Specifically, in the vicinity of an interface between electron transport layer 20 and electron supply layer 22, a 2-dimensional electron gas (2DEG) is generated. The 2DEG functions as the channel of electron transport layer 20. The 2DEG is provided along the interface between electron transport layer 20 and electron supply layer 22 parallel to first main surface 10a of substrate 10.

Although not shown in FIG. 1, an AlN film having a thickness of about 1 nm may be provided between electron transport layer 20 and electron supply layer 22. The AlN film can suppress alloy scattering and enhance the mobility of the channel.

Electron supply layer 22 is provided above electron transport layer 20. In other words, electron transport layer 20 and electron supply layer 22 are provided in this order from the side of substrate 10. Electron supply layer 22 is formed along the upper surface of electron transport layer 20 so as to have a substantially uniform thickness. Electron supply layer 22 is, for example, a film of undoped AlGaN which has a thickness of 50 nm.

Electron supply layer 22 forms the heterointerface of AlGaN/GaN with electron transport layer 20. In this way, the 2DEG is generated in electron transport layer 20. Electron supply layer 22 supplies electrons to the channel region (that is, the 2DEG) formed in electron transport layer 20.

Threshold adjustment layer 24 is an example of a third nitride semiconductor layer of the second conductivity type which is provided above electron supply layer 22. Specifically, threshold adjustment layer 24 is provided between gate electrode 26 and electron supply layer 22. Threshold adjustment layer 24 is formed along the upper surface of electron supply layer 22 so as to have a substantially uniform thickness.

Threshold adjustment layer 24 is, for example, a nitride semiconductor layer of p type GaN or AlGaN in which its thickness is in a range greater than or equal to 100 nm and less than or equal to 300 nm and its carrier concentration is $1 \times 10^{17}$ cm$^{-3}$. Threshold adjustment layer 24 is provided to raise the potential of the conduction band edge of a channel portion. Hence, it is possible to increase the threshold voltage of nitride semiconductor device 1. Therefore, it is possible to realize nitride semiconductor device 1 as a normally-off FET. In other words, when a potential of 0 V is applied to gate electrode 26, nitride semiconductor device 1 can be turned off.

Gate electrode 26 is disposed above threshold adjustment layer 24. Specifically, gate electrode 26 is provided in contact with the upper surface of threshold adjustment layer 24 in a position which overlaps current conducting portion 16 in plan view. For example, gate electrode 26 is formed along the upper surface of threshold adjustment layer 24 so as to have a substantially uniform thickness.

Gate electrode 26 is formed using a conductive material such as metal. For example, gate electrode 26 is formed using palladium (Pd). As the material of gate electrode 26, a material which is Schottky-connected to a p type GaN layer can be used, and examples of the material which can be used include a nickel (Ni)-based material, tungsten silicide (WSi), gold (Au), and the like.

Source electrode 28 is disposed away from gate electrode 26. In the present embodiment, source electrode 28 is provided on the upper surface of electron supply layer 22 with a gap so as not to make contact with threshold adjustment layer 24.

Source electrode 28 is formed using a conductive material such as metal. As the material of source electrode 28, for example, a material such as Ti/Al which is thermally processed to be ohmically connected to an n type GaN layer can be used.

Drain electrode 30 is provided on the side of the lower surface of substrate 10, that is, on the side opposite to drift layer 12. Specifically, drain electrode 30 is provided in contact with second main surface 10b of substrate 10. Drain electrode 30 is formed using a conductive material such as metal. As the material of drain electrode 30, as with the material of source electrode 28, for example, a material such as Ti/Al which is ohmically connected to an n type GaN layer can be used.

Figure 2:
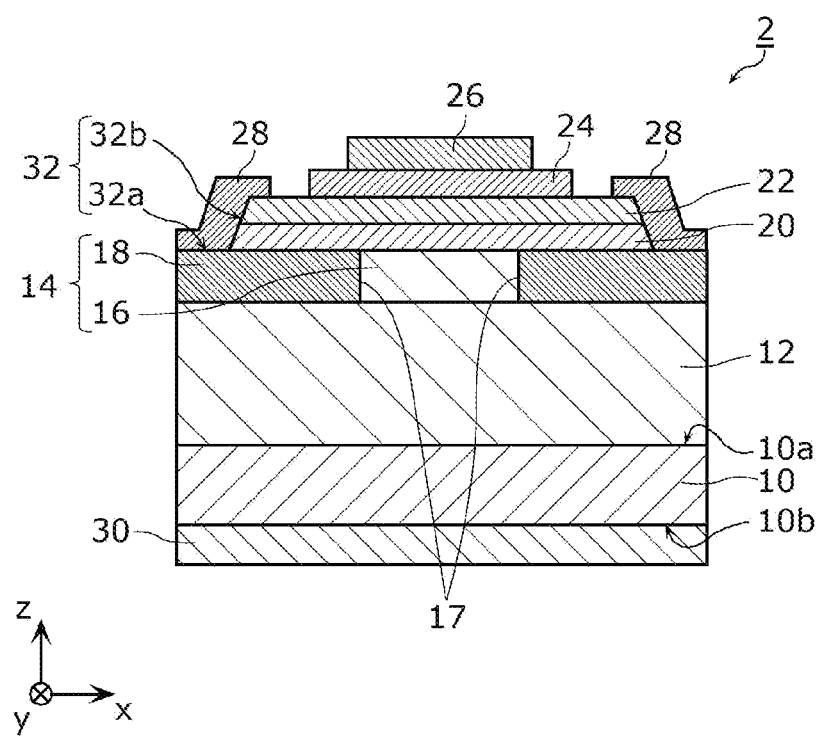
FIG. 2 is a cross-sectional view of another example of the nitride semiconductor device according to Embodiment 1.

Although FIG. 1 shows an example where source electrode 28 is disposed on the upper surface of electron supply layer 22, the present embodiment is not limited to this configuration. As shown in FIG. 2, source opening 32 may be provided, and source electrode 28 may be provided along the inner surface of source opening 32.

FIG. 2 is a cross-sectional view of nitride semiconductor device 2 according to the present embodiment. Nitride semiconductor device 2 differs from nitride semiconductor device 1 in that source opening 32 is provided.

Source opening 32 is an example of an opening which penetrates through electron supply layer 22 and electron transport layer 20 to reach current blocking portion 18 in a position distant from gate electrode 26 and threshold adjustment layer 24. Source opening 32 includes bottom 32a and side surface 32b.

Bottom 32a of source opening 32 is a portion of the upper surface of current blocking portion 18. As shown in FIG. 2, bottom 32a is located at the same height as the lower surface of electron transport layer 20. Here, the "at the same height" means that the distance from first main surface 10a of substrate 10 is the same. The bottom of electron transport layer 20 corresponds to an interface between electron transport layer 20 and aperture structure layer 14. For example, bottom 32a is parallel to first main surface 10a of substrate 10.

Bottom 32a may also be located lower than the lower surface of electron transport layer 20. In other words, source opening 32 may be formed by removing a portion of current blocking portion 18.

As shown in FIG. 2, source opening 32 is formed such that the opening area increases as the distance from substrate 10 increases. Specifically, side surface 32b of source opening 32 is inclined relative to bottom 32a. In other words, the cross-sectional shape of source opening 32 is an inverted trapezoid, and more specifically, is an inverted isosceles trapezoid.

The inclination angle of side surface 32b relative to bottom 32a may be, for example, in a range greater than or equal to 30° and less than or equal to 60°. For example, side surface 32b of source opening 32 is inclined, and thus a contact area between source electrode 28 and electron transport layer 20 (specifically, the 2DEG) is increased, with the result that an ohmic connection is easily made. The 2DEG is exposed to side surface 32b of source opening 32, and is connected to source electrode 28 at the exposed portion.

The cross-sectional shape of source opening 32 may be rectangular. In other words, side surface 32b may be perpendicular to bottom 32a.

In nitride semiconductor device 2 shown in FIG. 2, source electrode 28 is provided along the inner surface of source opening 32. Specifically, source electrode 28 is connected to electron supply layer 22, electron transport layer 20, and current blocking portion 18. Source electrode 28 is ohmically connected to electron transport layer and electron supply layer 22. Source electrode 28 is in direct contact with the 2DEG on side surface 32b. In this way, it is possible to reduce the contact resistance of source electrode 28 and the 2DEG.

Source electrode 28 is in contact with current blocking portion 18, and thus the potential of current blocking portion 18 is fixed to a potential which is applied to source electrode 28. In this way, an electric field which is applied to the channel in electron transport layer can be relaxed, and thus it is possible to suppress the development of current collapse.

[Aperture Structure Layer]

Aperture structure layer 14 which is a characteristic configuration of nitride semiconductor device 1 or 2 according to the present embodiment will then be described with reference to FIGS. 3A and 3B. Although nitride semiconductor device 2 will be described below as an example, the same is true for nitride semiconductor device 1.

Figure 3A:
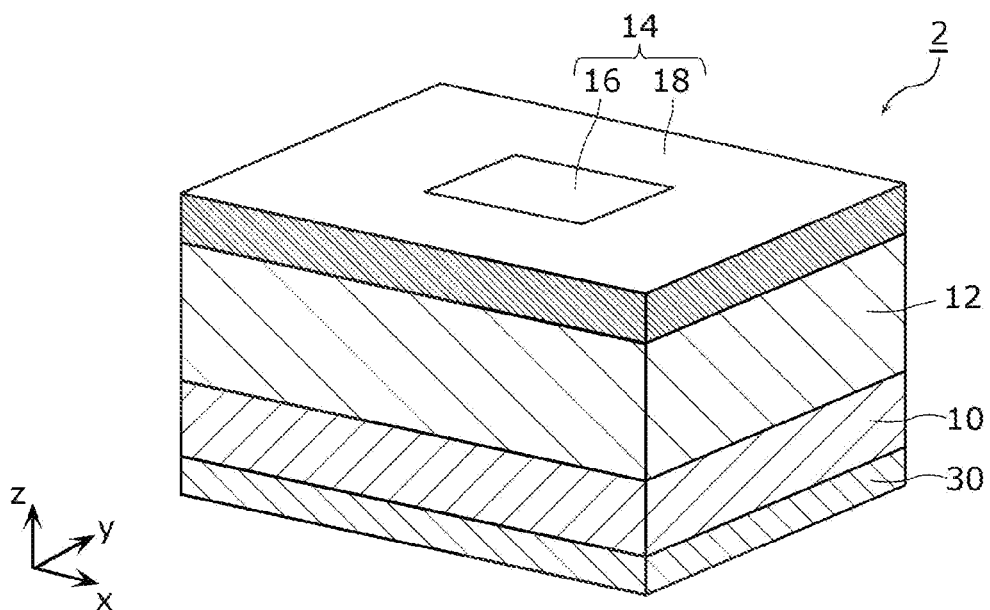
FIG. 3A is a perspective view showing a current conducting portion and a current blocking portion of the nitride semiconductor device according to Embodiment 1.
Figure 3B:
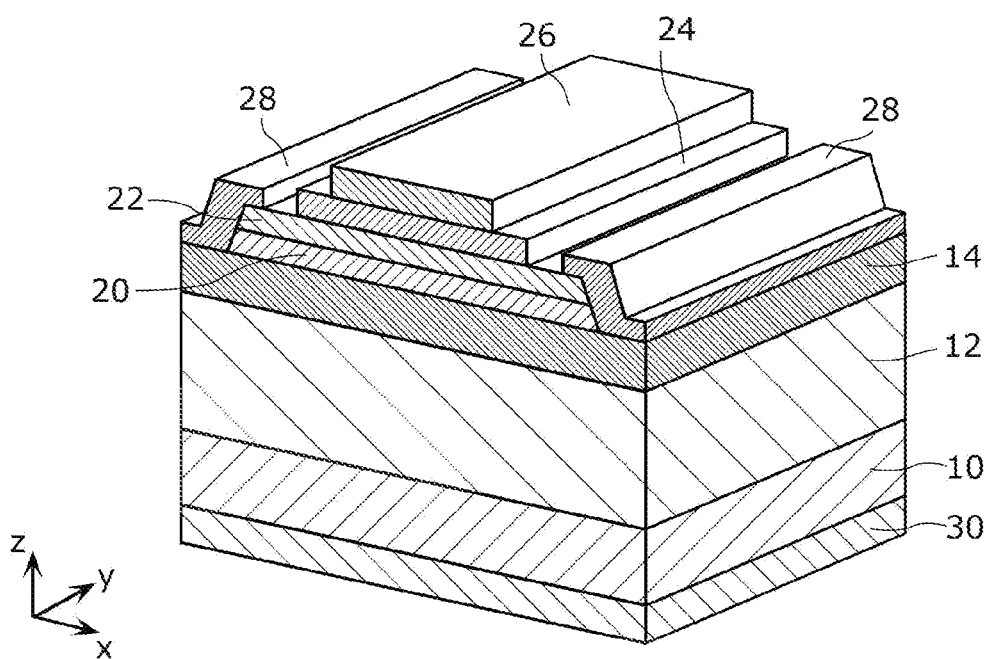
FIG. 3B is a perspective view of the nitride semiconductor device according to Embodiment 1.

FIG. 3A is a perspective view showing current conducting portion 16 and current blocking portion 18 of nitride semiconductor device 2 according to the present embodiment. FIG. 3B is a perspective view of nitride semiconductor device 2 according to Embodiment 1.

Aperture structure layer 14 is a nitride semiconductor layer which is located between drift layer 12 and electron transport layer 20. The thickness of aperture structure layer 14 is substantially uniform, and is, for example, in a range greater than or equal to 100 nm and less than or equal to 1 µm. Although an example of the thickness of aperture structure layer 14 is 350 nm, the present embodiment is not limited to this value. The thickness of current conducting portion 16 is the same as that of current blocking portion 18.

As shown in FIG. 3A, aperture structure layer 14 includes current conducting portion 16 and current blocking portion 18. In the present embodiment, one of current conducting portion 16 and current blocking portion 18 is formed by epitaxial growth of a nitride semiconductor, and the other is formed by ion implantation.

Current conducting portion 16 is an example of a current conducting portion of the first conductivity type which is located to overlap gate electrode 26. For example, current conducting portion 16 is completely covered by gate electrode 26 and threshold adjustment layer 24. In other words, current conducting portion 16 is located inside gate electrode 26 in plan view.

Current conducting portion 16 is formed using a nitride semiconductor which includes a first impurity. The first impurity is an n type impurity and is specifically Si. Current conducting portion 16 is a portion of n type GaN including Si.

The Si concentration of current conducting portion 16 is, for example, in a range greater than or equal to $1 \times 10^{15}$ cm$^{-3}$ and less than or equal to $1 \times 10^{19}$ cm$^{-3}$. The Si concentration of current conducting portion 16 is, for example, the same as that of drift layer 12. In the present embodiment, the Si concentration of current conducting portion 16 is uniform in the thickness direction of aperture structure layer 14 (the direction of the z-axis, also referred as the "depth direction").

The "uniform" means that variations in the impurity concentration are sufficiently low. Specifically, the "uniform" means that when the impurity concentration is measured in the depth direction by secondary ion mass spectrometry (SIMS) analysis, the impurity concentration is in a range greater than or equal to 50% and less than or equal to 200% of the average value thereof. In other words, the "uniform" means that for example, when the average value is $1 \times 10^{18}$ cm$^{-3}$, the impurity concentration is in a range greater than or equal to $5 \times 10^{17}$ cm$^{-3}$ and less than or equal to $2 \times 10^{18}$ cm$^{-3}$.

The Si concentration of current conducting portion 16 is higher than that of electron transport layer 20. In other words, the Si concentration of electron transport layer 20 is lower than that of current conducting portion 16. The Si concentration of electron transport layer 20 is lowered, and thus the pinch-off characteristic of nitride semiconductor device 2 is enhanced.

Current blocking portion 18 is an example of a current blocking portion of the second conductivity type which is provided about current conducting portion 16. Specifically, as shown in FIG. 3A, current blocking portion 18 surrounds the entire periphery of current conducting portion 16.

Current blocking portion 18 is formed using a nitride semiconductor which includes a second impurity different from the first impurity. The second impurity is a p type impurity and is specifically Mg. Current blocking portion 18 is a portion of p type GaN including Mg.

The Mg concentration of current blocking portion 18 is distributed such that a peak is present in the thickness direction of aperture structure layer 14. In other words, the Mg concentration of current blocking portion 18 is not uniform. For example, the average value of the Mg concentration of current blocking portion 18 is in a range greater than or equal to $1 \times 10^{18}$ cm$^{-3}$ and less than or equal to $1 \times 10^{19}$ cm$^{-3}$.

In the present embodiment, as shown in FIG. 3A, current conducting portion 16 is surrounded by current blocking portion 18 in plan view. The entire periphery of current conducting portion 16 is surrounded by current blocking portion 18 in plan view. In other words, interface 17 between current conducting portion 16 and current blocking portion 18 is formed in an annular shape in plan view. Interface 17 is perpendicular to first main surface 10a of substrate 10.

Current conducting portion 16 functions as the path of a drain current which flows when nitride semiconductor device 2 is on. In other words, since drift layer 12 and current conducting portion 16 each are of n type GaN, the drain current from drain electrode 30 flows to source electrode 28 through drift layer 12, current conducting portion 16, and electron transport layer 20 in this order.

Since current blocking portion 18 is of p type GaN, a pn junction is formed with n type drift layer 12. When nitride semiconductor device 2 is on, a reverse bias is applied to the pn junction. Hence, the drain current does not flow through current blocking portion 18.

In the present embodiment, current conducting portion 16 and current blocking portion 18 are located in the same layer. In other words, the heights of current conducting portion 16 and current blocking portion 18 from first main surface 10a of substrate 10 are the same as each other. For example, the upper surface of current conducting portion 16 and the upper surface of current blocking portion 18 are flush with each other, and are parallel to first main surface 10a. The lower surface of current conducting portion 16 and the lower surface of current blocking portion 18 are flush with each other, and are parallel to first main surface 10a. In other words, the upper surface and the lower surface of aperture structure layer 14 are parallel to first main surface 10a of substrate 10.

In this way, electron transport layer 20 and electron supply layer 22 can be sequentially formed on the flat upper surface of aperture structure layer 14, and thus crystal defects which are generated in electron transport layer 20 and electron supply layer 22 are suppressed. Hence, pits which are caused by crystal defects are unlikely to be generated in the upper surface of electron supply layer 22.

Hence, Schottky contact of gate electrode 26 is suppressed, and thus it is possible to suppress the deterioration of yields in the forward direction characteristic of the FET. The impurity concentration of electron transport layer 20 including the channel is lowered, and thus the pinch-off characteristic of the FET is enhanced. As described above, in the present embodiment, nitride semiconductor device 1 or 2 in which electrical properties are improved is realized.

[Manufacturing Method]

A method for manufacturing nitride semiconductor devices 1 and 2 according to the present embodiment will then be described with reference to FIGS. 4A to 4F. FIGS. 4A to 4F are cross-sectional views showing steps in the method for manufacturing nitride semiconductor devices 1 and 2 according to the present embodiment.

Figure 4A:
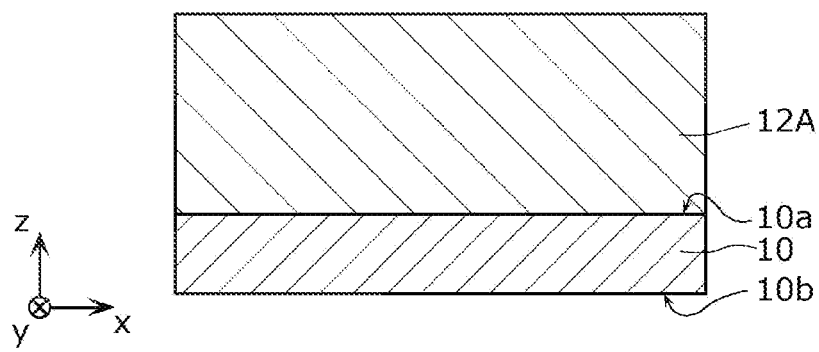
FIG. 4A is a cross-sectional view showing a step in a method for manufacturing the nitride semiconductor device according to Embodiment 1.

As shown in FIG. 4A, n type nitride semiconductor film 12A is formed (first step) on first main surface 10a of substrate 10 by crystal growth such as metalorganic vapor phase epitaxial growth (MOVPE). The film formation described above includes not only the first step but also a film formation step which is a portion of a second step to be described later.

Figure 4B:
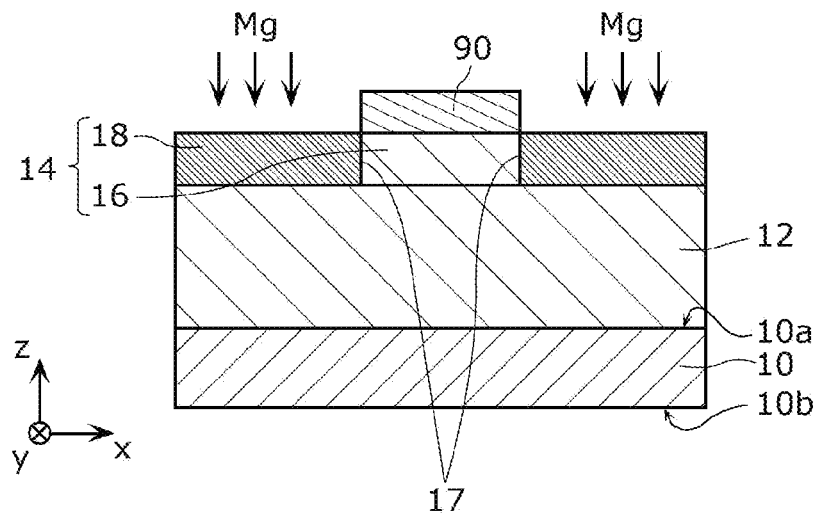
FIG. 4B is a cross-sectional view showing a step in the method for manufacturing the nitride semiconductor device according to Embodiment 1.

Then, as shown in FIG. 4B, current blocking portion 18 is formed (ion implantation step in the second step) by ion-implanting an impurity into only a portion of nitride semiconductor film 12A which has been formed. The impurity is, for example, Mg.

Specifically, resist mask 90 of a predetermined shape is first formed on the upper surface of nitride semiconductor film 12A. Resist mask 90 is formed, for example, by applying a photosensitive resist and thereafter patterning the resist into a predetermined shape by photolithography. In plan view, resist mask 90 has an opening in a region in which current blocking portion 18 needs to be formed. In a state where resist mask 90 is disposed, Mg ions are implanted. Conditions of the ion implantation are not particularly limited as long as Mg can be implanted in a predetermined thickness range at a predetermined concentration or more.

Figure 5:
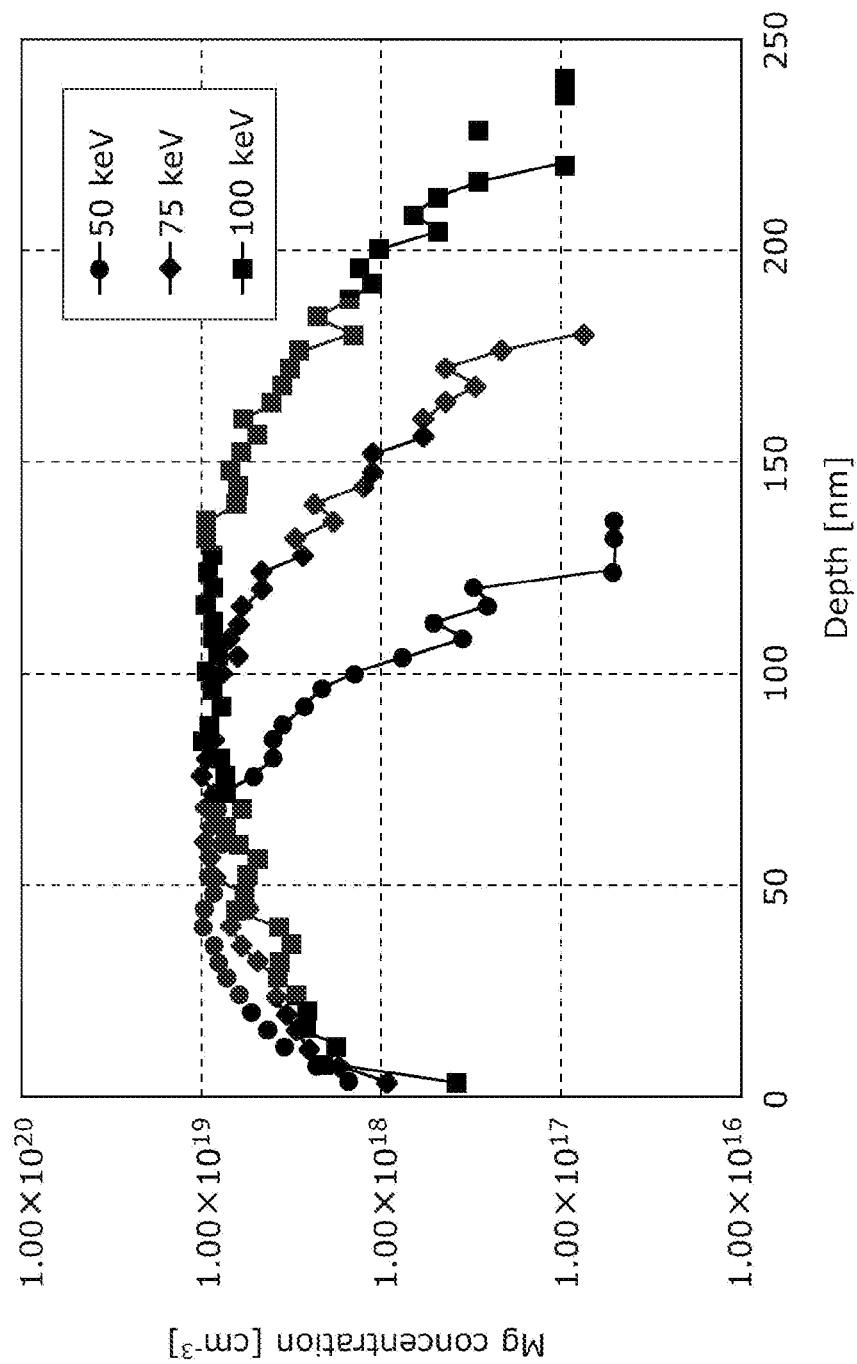
FIG. 5 is a diagram showing the concentration distribution of an impurity included in the current blocking portion formed through the step shown in FIG. 4B.

FIG. 5 is a diagram showing the concentration distribution of the impurity included in current blocking portion 18 formed through the step shown in FIG. 4B. The horizontal axis represents a depth from the upper surface of nitride semiconductor film 12A, and the vertical axis represents the concentration of the impurity (here, Mg). As shown in FIG. 5, it is found that as the energy of the ion implantation is increased, the impurity is implanted into a deeper position. In other words, as the energy of the ion implantation is increased, the thickness of current blocking portion 18 can be increased.

In the ion implantation, in the vicinity of the surface (that is, a region whose depth is close to 0 nm) and in a deep region (depending on the magnitude of energy), the impurity concentration is not stable. Hence, in current blocking portion 18, the concentration of the impurity is distributed such that a peak is present around the center in the thickness direction (depth direction).

As described above, current blocking portion 18 is formed by ion implantation. As shown in FIG. 4B, a portion which is located in the same layer as current blocking portion 18 and on which ion implantation is not performed serves as current conducting portion 16. A deeper region (that is, a region closer to substrate 10) than current blocking portion 18 and current conducting portion 16 serves as drift layer 12.

In the present embodiment, each of drift layer 12 and current conducting portion 16 is formed by epitaxial growth. Hence, the concentration of the n type impurity in drift layer 12 and the concentration of the n type impurity in current conducting portion 16 are the same as each other, and are uniform, for example, in the thickness direction (depth direction).

Figure 4C:
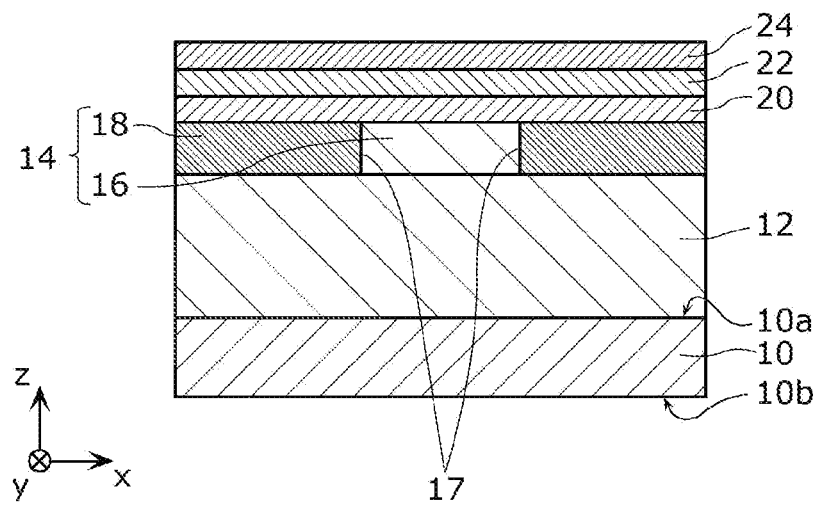
FIG. 4C is a cross-sectional view showing a step in the method for manufacturing the nitride semiconductor device according to Embodiment 1.

Then, as shown in FIG. 4C, after removal of resist mask 90, electron transport layer 20, electron supply layer 22, and threshold adjustment layer 24 are sequentially formed by crystal regrowth in MOVPE (third step). The formation of the layers is continuously performed, and thus the interfaces of the layers are satisfactory, with the result that defects such as a surface level can be less likely to occur.

Figure 4D:
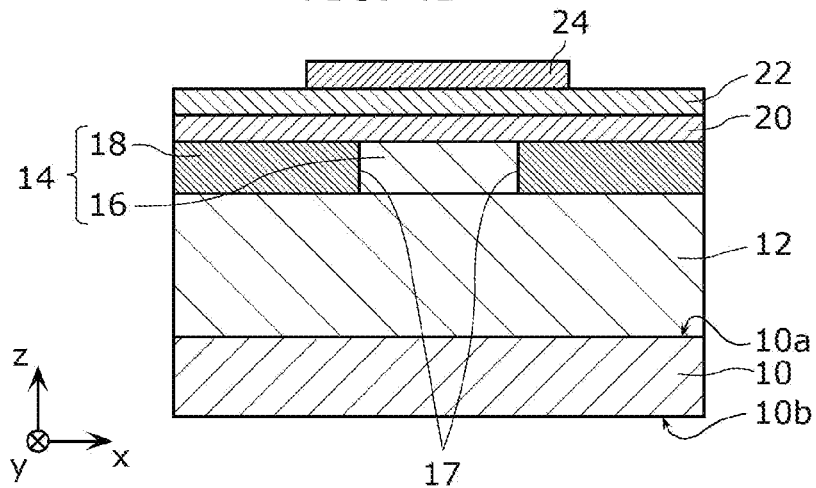
FIG. 4D is a cross-sectional view showing a step in the method for manufacturing the nitride semiconductor device according to Embodiment 1.
Figure 4E:
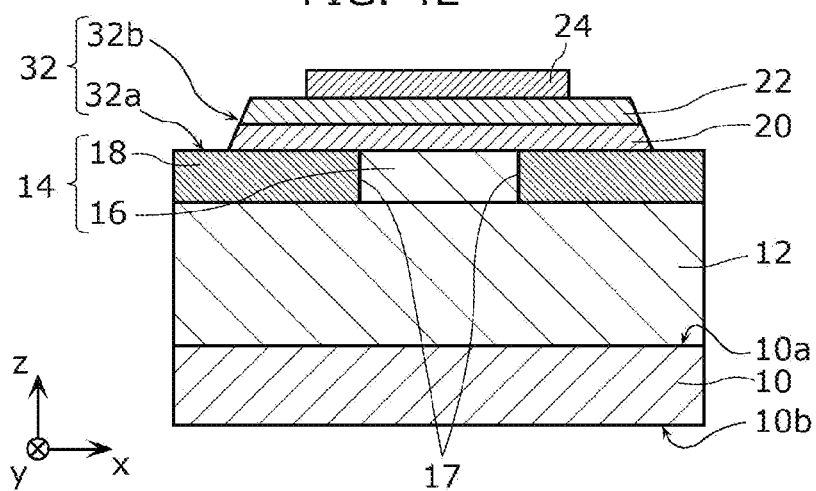
FIG. 4E is a cross-sectional view showing a step in the method for manufacturing the nitride semiconductor device according to Embodiment 1.

Then, as shown in FIG. 4D, threshold adjustment layer 24 is patterned into a predetermined shape by photolithography and etching (fourth step). Then, as shown in FIG. 4E, electron supply layer 22 and electron transport layer 20 are patterned into predetermined shapes by photolithography and etching. In this way, source opening 32 is formed. When nitride semiconductor device 1 is manufactured, it is not necessary to form source opening 32, and thus electron supply layer 22 and electron transport layer 20 do not need to be patterned.

Figure 4F:
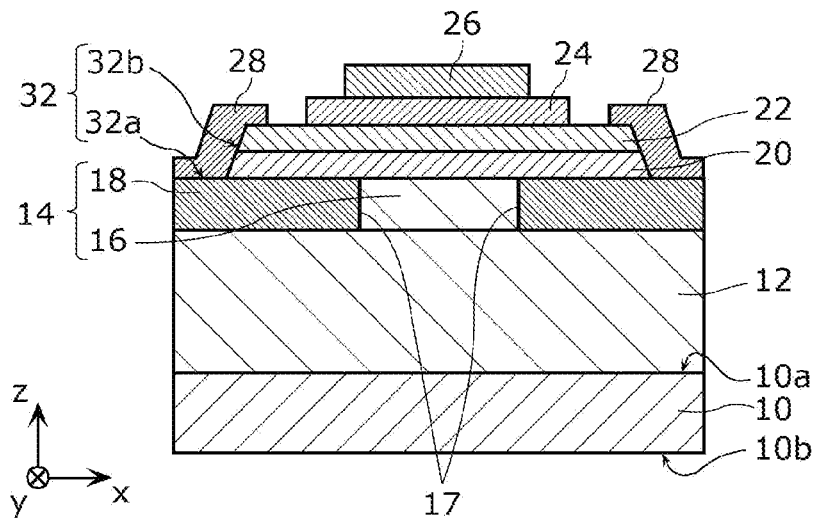
FIG. 4F is a cross-sectional view showing a step in the method for manufacturing the nitride semiconductor device according to Embodiment 1.

Then, as shown in FIG. 4F, gate electrode 26 is formed above threshold adjustment layer 24 (fifth step). For example, a resist is patterned into a predetermined shape, and a conductive electrode material is formed into a film by vapor deposition or sputtering and is thereafter lifted off to form gate electrode 26 of a predetermined shape.

Source electrode 28 is formed on electron supply layer 22 (sixth step). Specifically, source electrode 28 is formed along the inner surface of source opening 32. For example, a resist is patterned into a predetermined shape, and a conductive electrode material is formed into a film by vapor deposition or sputtering and is thereafter lifted off to form source electrode 28 of a predetermined shape. The order of the formation of gate electrode 26 and the formation of source electrode 28 is not limited.

Then, drain electrode 30 is formed on second main surface 10b of substrate 10 (seventh step). For example, a conductive electrode material is formed into a film by vapor deposition or sputtering, and thus drain electrode 30 is formed.

Nitride semiconductor device 1 or 2 shown in FIG. 1 or 2 is manufactured through the steps described above.

Although in the above description, the example is shown where current blocking portion 18 is formed by ion implantation, current conducting portion 16 may be formed by ion implantation.

Figure 6A:
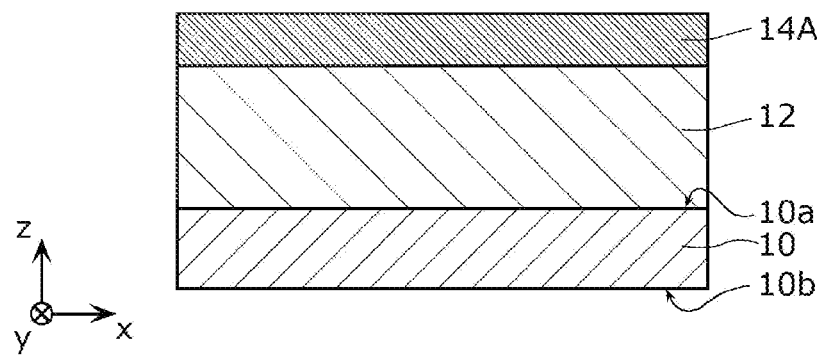
FIG. 6A is a cross-sectional view showing a step in another method for manufacturing the nitride semiconductor device according to Embodiment 1.
Figure 6B:
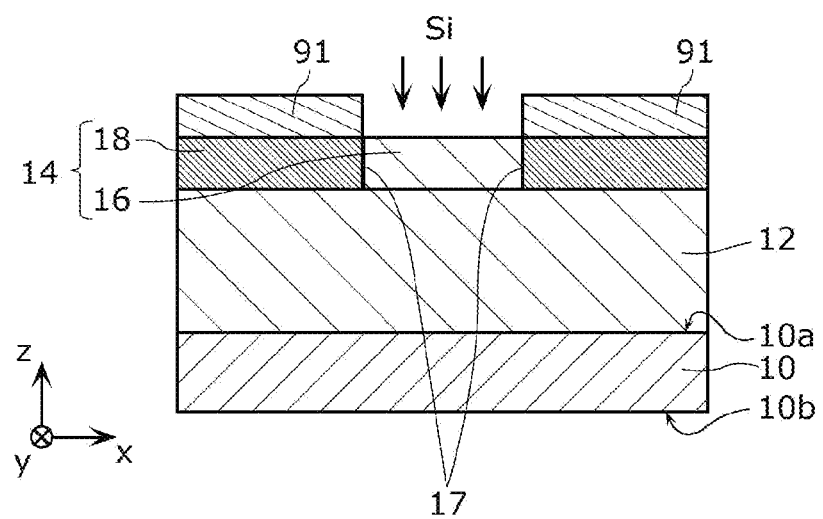
FIG. 6B is a cross-sectional view showing a step in the other method for manufacturing the nitride semiconductor device according to Embodiment 1.

FIGS. 6A and 6B are cross-sectional views showing a variation of the method for manufacturing nitride semiconductor device 1 and 2 according to the present embodiment.

In the present variation, as shown in FIG. 6A, on first main surface 10a of substrate 10, drift layer 12 and p type nitride semiconductor film 14A are first formed in this order by crystal growth such as metalorganic vapor phase epitaxial growth (MOVPE) (the film formation step in the first step and the second step).

Then, as shown in FIG. 6B, an impurity is ion-implanted into only a portion of nitride semiconductor film 14A which has been formed, and thus current conducting portion 16 is formed (the ion implantation step in the second step). The impurity is, for example, Si.

Specifically, resist mask 91 of a predetermined shape is first formed on the upper surface of nitride semiconductor film 14A. In plan view, resist mask 91 has an opening in a region in which current conducting portion 16 needs to be formed. In a state where resist mask 91 is disposed, Si ions are implanted. Conditions of the ion implantation are not particularly limited as long as Si can be implanted in a predetermined thickness range at a predetermined concentration or more.

Figure 7:
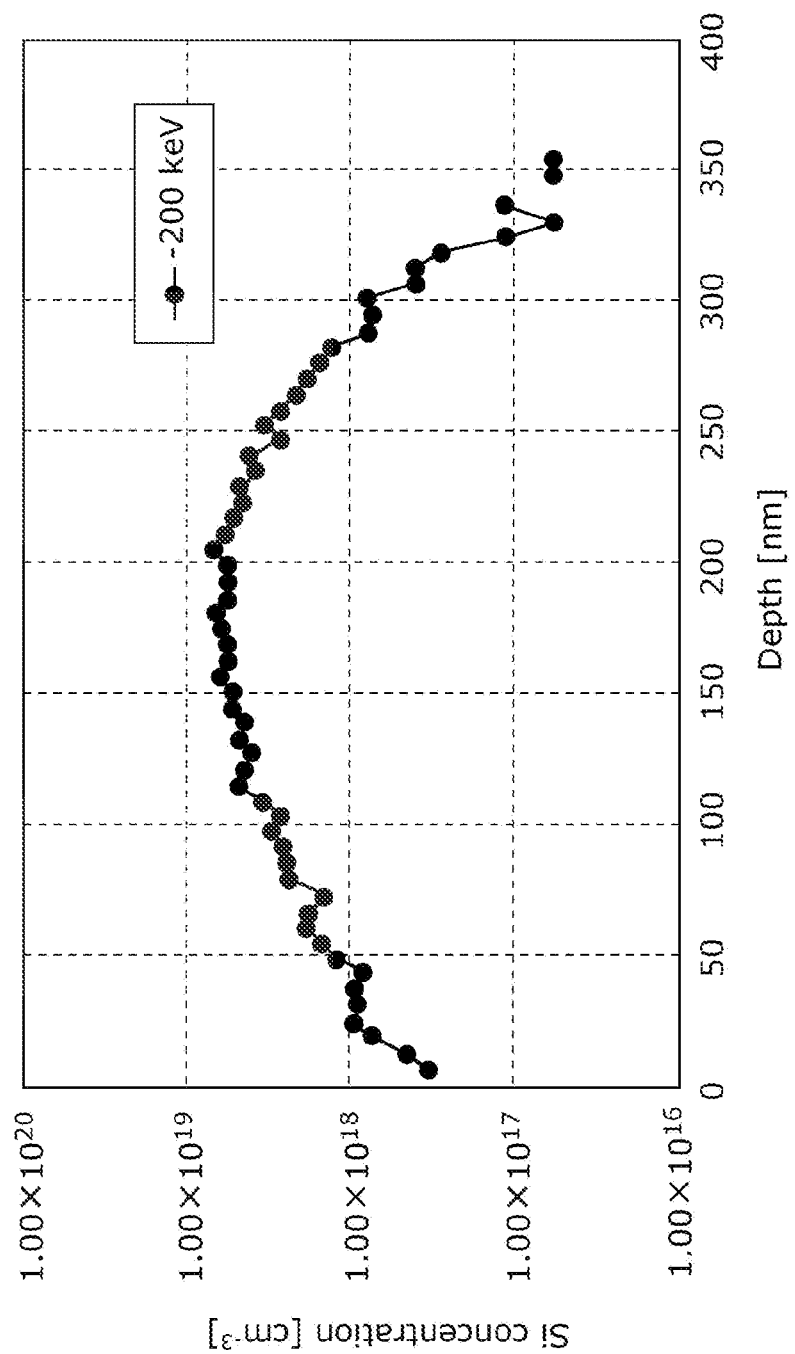
FIG. 7 is a diagram showing the concentration distribution of an impurity included in the current conducting portion formed through the step shown in FIG. 6B.

FIG. 7 is a diagram showing the concentration distribution of the impurity included in current conducting portion 16 formed through the step shown in FIG. 6B. The horizontal axis represents a depth from the upper surface of nitride semiconductor film 14A, and the vertical axis represents the concentration of the impurity (here, Si). Although FIG. 7 shows only a case where the energy of the ion implantation is 200 keV, as in the case shown in FIG. 5, as the energy of the ion implantation is increased, the impurity can be implanted into a deeper position.

In the ion implantation, in the vicinity of the surface (that is, a region whose depth is close to 0 nm) and in a deep region (depending on the magnitude of energy), the impurity concentration is not stable. Hence, in current conducting portion 16, the concentration of the impurity is distributed such that a peak is present around the center in the thickness direction (depth direction).

As described above, current conducting portion 16 is formed by ion implantation. As shown in FIG. 6B, a portion (portion of nitride semiconductor film 14A) which is located in the same layer as current conducting portion 16 and on which ion implantation is not performed serves as current blocking portion 18. Current blocking portion 18 is formed by epitaxial growth. Hence, for example, the concentration of the p type impurity in current blocking portion 18 is uniform in the thickness direction.

Embodiment 2

Embodiment 2 will then be described.

A nitride semiconductor device according to Embodiment 2 differs from that according to Embodiment 1 in that a nitride semiconductor layer doped with carbon is provided between the drift layer and the aperture structure layer. Differences from Embodiment 1 will be mainly described below, and common description is omitted or simplified.

Figure 8:
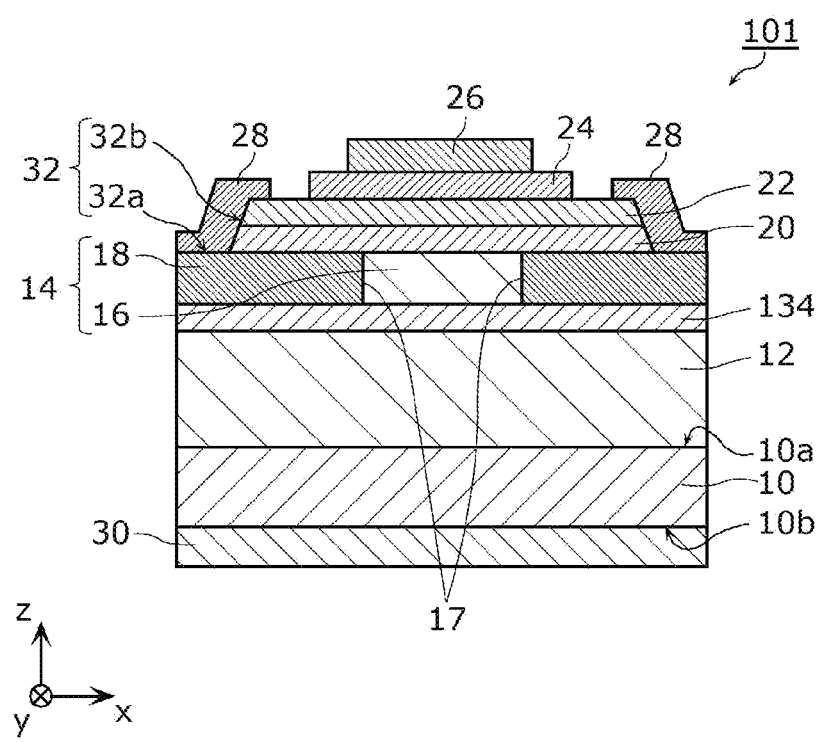
FIG. 8 is a cross-sectional view of a nitride semiconductor device according to Embodiment 2.

FIG. 8 is a cross-sectional view of nitride semiconductor device 101 according to the present embodiment. As shown in FIG. 8, nitride semiconductor device 101 includes carbon-doped layer 134 in addition to the configuration of nitride semiconductor device 2 according to Embodiment 1.

Carbon-doped layer 134 is an example of a fourth nitride semiconductor layer which is provided between aperture structure layer 14 and drift layer 12 and is doped with carbon (c). In the present embodiment, carbon-doped layer 134 is provided between current conducting portion 16 and current blocking portion 18 and drift layer 12. In other words, carbon-doped layer 134 overlaps current conducting portion 16 and current blocking portion 18 in plan view.

Carbon-doped layer 134 is, for example, a film of GaN doped with carbon. The carbon concentration of carbon-doped layer 134 is, for example, in a range greater than or equal to $2\times10^{16}$ cm$^{-3}$ and less than or equal to $1\times10^{20}$ cm$^{-3}$, and an example of the carbon concentration is $1\times10^{18}$ cm$^{-3}$.

The thickness of carbon-doped layer 134 is, for example, greater than or equal to 20 nm and less than or equal to 1 μm, and an example of the thickness is 200 nm. Carbon-doped layer 134 is formed, for example, by epitaxial growth after formation of drift layer 12. Carbon-doped layer 134 may also be formed by ion implantation after formation of drift layer 12.

Carbon-doped layer 134 is a high resistance layer whose resistance is higher than those of drift layer 12, current conducting portion 16, and current blocking portion 18. Carbon-doped layer 134 and current blocking portion 18 are stacked, and thus the voltage resistance of nitride semiconductor device 101 can be further enhanced.

The shape of carbon-doped layer 134 is not limited to an example shown in FIG. 8.

Figure 9:
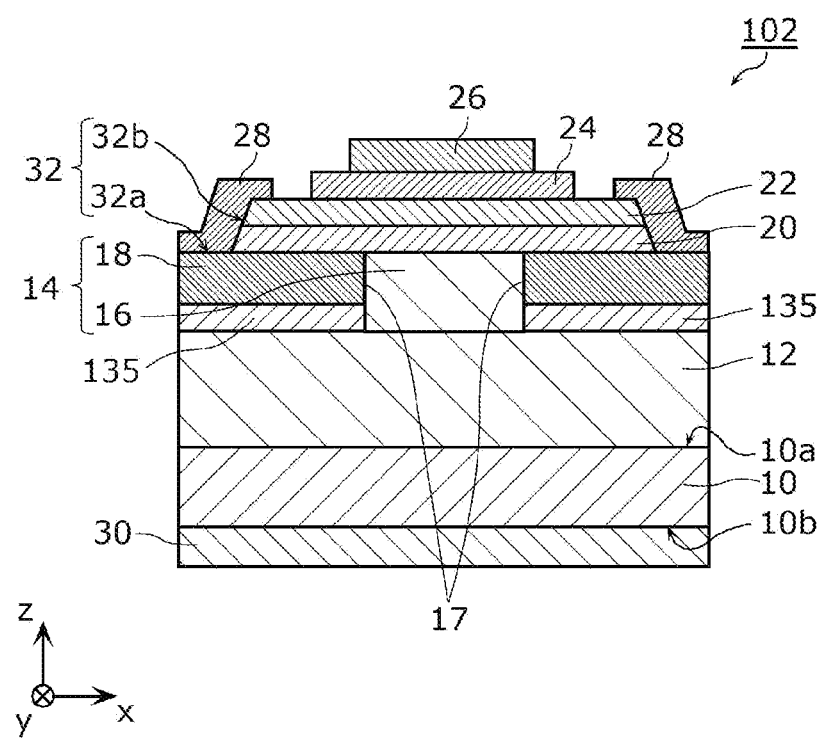
FIG. 9 is a cross-sectional view of a nitride semiconductor device according to a variation of Embodiment 2.

FIG. 9 is a cross-sectional view of nitride semiconductor device 102 according to a variation of the present embodiment. As shown in FIG. 9, nitride semiconductor device 102 differs from nitride semiconductor device 101 in that carbon-doped layer 135 is provided instead of carbon-doped layer 134.

Carbon-doped layer 135 is provided in a region which overlaps only current blocking portion 18 out of current conducting portion 16 and current blocking portion 18 in plan view. In other words, carbon-doped layer 135 is not provided in a region which overlaps current conducting portion 16 in plan view. Carbon-doped layer 135 is formed, for example, by selectively implanting the n type impurity into only a region of carbon-doped layer 134 formed on the entire surface which overlaps current conducting portion 16 in plan view. Carbon-doped layer 135 may also be formed by selectively implanting carbon into only a region of n type nitride semiconductor film 12A shown in FIG. 4A or drift layer 12 shown in FIG. 6A which overlaps current blocking portion 18 in plan view.

In nitride semiconductor device 102, as in nitride semiconductor device 101, the voltage resistance can be further enhanced. In nitride semiconductor device 102, on the path of the drain current from drift layer 12 to current conducting portion 16, carbon-doped layer 135 is not provided, and thus it is possible to suppress an increase in the on resistance.

In nitride semiconductor device 101 or 102, as in nitride semiconductor device 1 according to Embodiment 1, source opening 32 does not need to be provided.

Embodiment 3

Embodiment 3 will then be described.

A nitride semiconductor device according to Embodiment 3 differs from that according to Embodiment 1 in that the electron supply layer has a recess structure. Differences from Embodiment 1 will be mainly described below, and common description is omitted or simplified.

Figure 10:
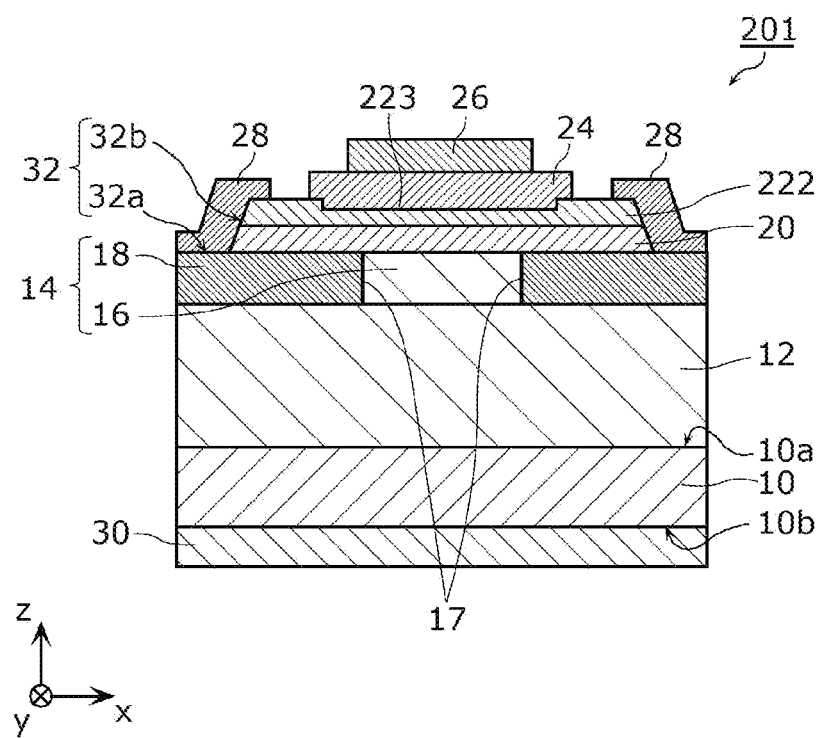
FIG. 10 is a cross-sectional view of a nitride semiconductor device according to Embodiment 3.

FIG. 10 is a cross-sectional view of nitride semiconductor device 201 according to the present embodiment. As shown in FIG. nitride semiconductor device 201 differs from nitride semiconductor device 2 in that electron supply layer 222 is provided instead of electron supply layer 22.

Electron supply layer 222 differs from electron supply layer 22 in that electron supply layer 222 includes recess 223. Recess 223 is a recess which is recessed toward substrate 10 from the upper surface of electron supply layer 222. Recess 223 is provided in a position which overlaps gate electrode 26, threshold adjustment layer 24, and current conducting portion 16 in plan view. The end portion of recess 223 on the side of source electrode 28 overlaps current blocking portion 18 in plan view. In other words, recess 223 is larger than current conducting portion 16 and is smaller than threshold adjustment layer 24 in plan view. For example, recess 223 is one side larger than current conducting portion 16 in plan view to completely cover current conducting portion 16. Threshold adjustment layer 24 is one side larger than recess 223 in plan view to completely cover recess 223.

Recess 223 is provided, and thus it is possible to form a portion in which the thickness of electron supply layer 222 is large and a portion in which the thickness is small. In other words, in the portion in which recess 223 is provided, the thickness of electron supply layer 222 is small, and thus it is possible to maintain the controllability of the channel by gate electrode 26. On the other hand, in the portion in which recess 223 is not provided, the thickness of electron supply layer 222 can be increased, and thus the concentration of the 2DEG generated in electron transport layer 20 can be increased in a region immediately below the portion in which the thickness is increased. The concentration of the 2DEG is increased, and thus the on resistance can be reduced.

Although in FIG. 10, the thickness of threshold adjustment layer 24 is not uniform and is provided so as to fill recess 223, the present embodiment is not limited to this configuration. For example, the thickness of threshold adjustment layer 24 may be uniform. In other words, threshold adjustment layer 24 may be provided along the inner surface of recess 223, and the upper surface may be recessed along recess 223. In this case, gate electrode 26 may be curved to have a uniform thickness or may be provided so as to fill the recess of the upper surface of threshold adjustment layer 24.

As in Embodiment 2 or in the variation of Embodiment 2, nitride semiconductor device 201 includes carbon-doped layer 134 or 135. Alternatively, in nitride semiconductor device 201, as in nitride semiconductor device 1 according to Embodiment 1, source opening 32 does not need to be provided.

Embodiment 4

Embodiment 4 will then be described.

A nitride semiconductor device according to Embodiment 4 differs from that according to Embodiment 1 in that a current diffusion layer is provided between the aperture structure layer and the drift layer. Differences from Embodiment 1 will be mainly described below, and common description is omitted or simplified.

Figure 11:
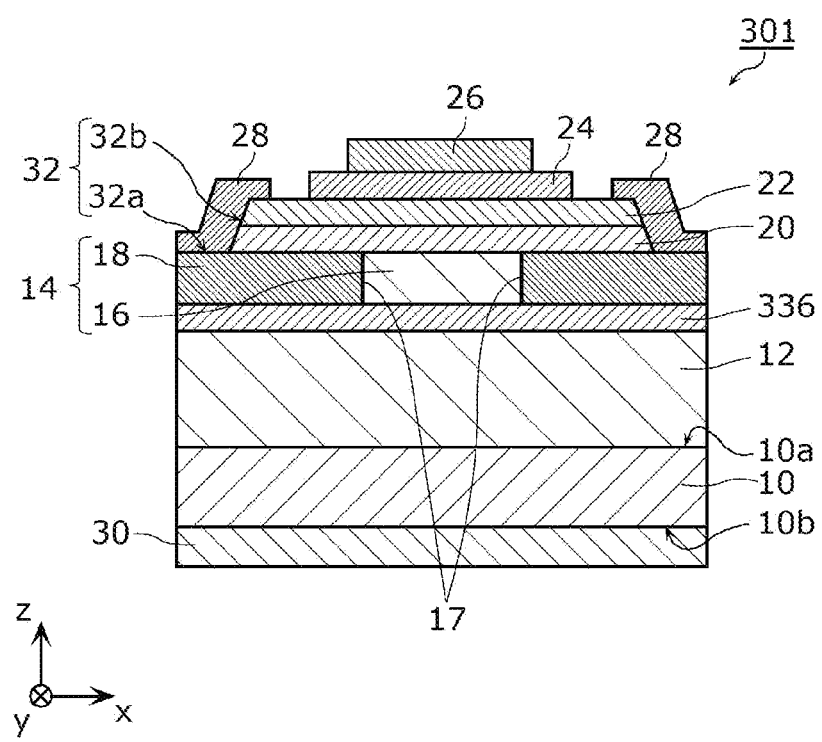
FIG. 11 is a cross-sectional view of a nitride semiconductor device according to Embodiment 4.

FIG. 11 is a cross-sectional view of nitride semiconductor device 301 according to the present embodiment. As shown in FIG. 11, nitride semiconductor device 301 includes current diffusion layer 336 in addition to the structure of nitride semiconductor device 2.

Current diffusion layer 336 is a nitride semiconductor layer which is provided between drift layer 12 and aperture structure layer 14 and in which the n type carrier concentration is higher than that of drift layer 12. Current diffusion layer 336 is, for example, a film of n$^+$ type GaN in which its thickness is 0.2 μm. The impurity concentration (donor concentration) of current diffusion layer 336 is, for example, in a range greater than or equal to $1 \times 10^{16}$ cm$^{-3}$ and less than or equal to $1 \times 10^{18}$ cm$^{-3}$, and an example of the impurity concentration is $1 \times 10^{17}$ cm$^{-3}$. Current diffusion layer 336 may have a stacking structure of an n$^+$ type AlGaN layer and an n$^+$ type GaN layer. Current diffusion layer 336 may also be a graphite layer including graphene.

Current diffusion layer 336 is provided between current conducting portion 16 and current blocking portion 18 and drift layer 12. In other words, current diffusion layer 336 overlaps current conducting portion 16 and current blocking portion 18 in plan view.

Current diffusion layer 336 is formed, for example, by epitaxial growth after formation of drift layer 12. Current diffusion layer 336 may also be formed by ion implantation after formation of drift layer 12.

Current diffusion layer 336 is provided, and thus the drain current is diffused laterally in current diffusion layer 336. Hence, drift layer 12 can be widely utilized as the path of the drain current, and thus it is possible to reduce the on resistance of nitride semiconductor device 301.

As in Embodiment 2, nitride semiconductor device 301 may include carbon-doped layer 134 or 135.

Figure 12:
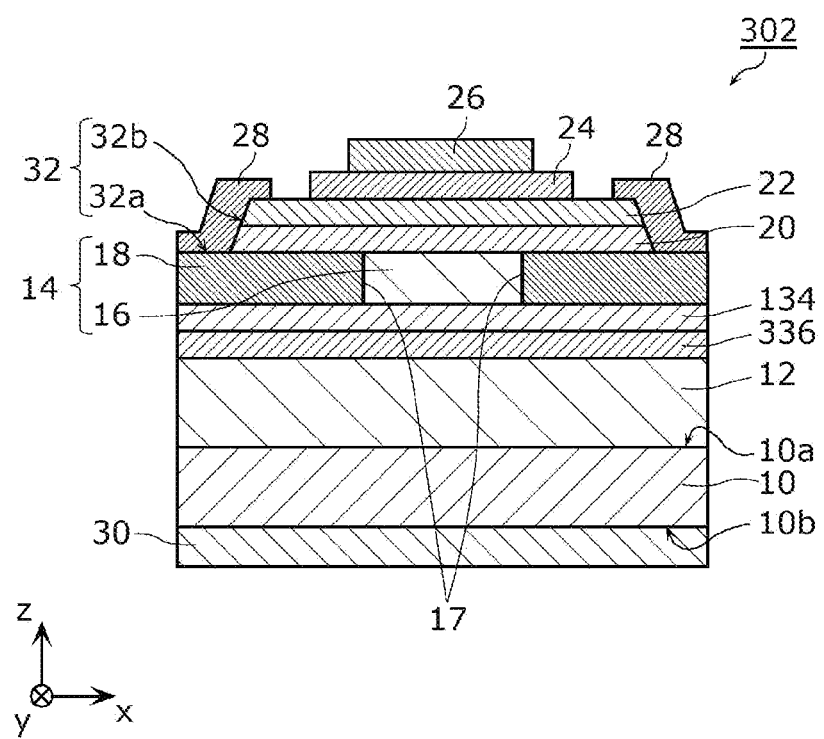
FIG. 12 is a cross-sectional view of a nitride semiconductor device according to Variation 1 of Embodiment 4.

FIG. 12 is a cross-sectional view of nitride semiconductor device 302 according to Variation 1 of the present embodiment. As shown in FIG. 12, nitride semiconductor device 302 includes carbon-doped layer 134 in addition to the structure of nitride semiconductor device 301. Carbon-doped layer 134 is the same as in Embodiment 2.

Figure 13:
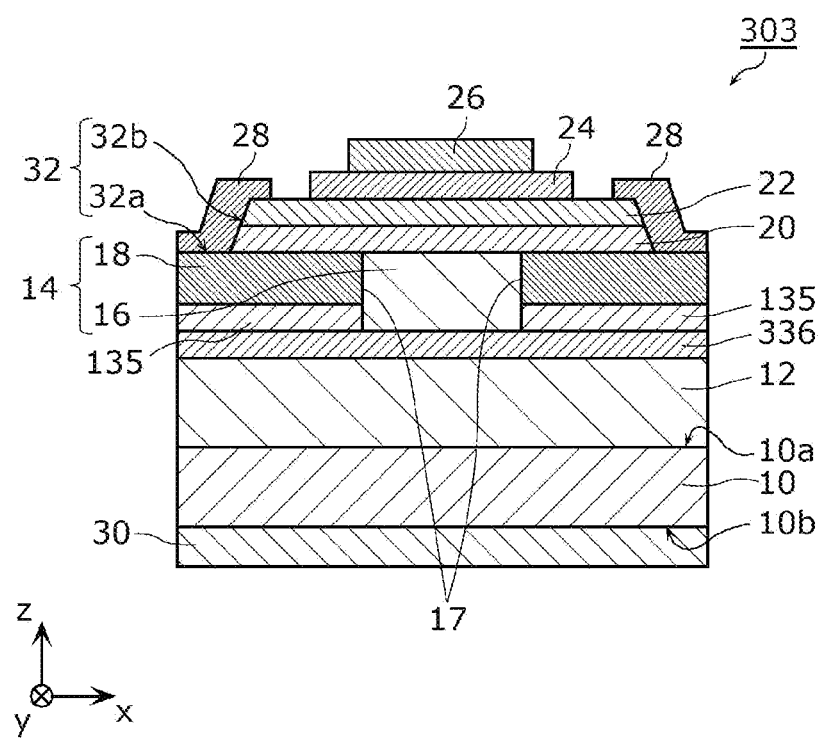
FIG. 13 is a cross-sectional view of a nitride semiconductor device according to Variation 2 of Embodiment 4.

FIG. 13 is a cross-sectional view of nitride semiconductor device 303 according to Variation 2 of the present embodiment. As shown in FIG. 13, nitride semiconductor device 303 includes carbon-doped layer 135 in addition to the structure of nitride semiconductor device 301. Carbon-doped layer 135 is the same as in the variation of Embodiment 2.

Carbon-doped layer 134 or 135 is provided between aperture structure layer 14 and current diffusion layer 336. In other words, current diffusion layer 336 is provided between carbon-doped layer 134 or 135 and drift layer 12.

In nitride semiconductor device 302 or 303 according to Variation 1 or 2, current diffusion layer 336 is provided, and thus it is possible to reduce the on resistance. Carbon-doped layer 134 or 135 is provided, and thus it is possible to enhance the voltage resistance.

As in Embodiment 3, nitride semiconductor device 301, 302, or 303 may include, instead of electron supply layer 22, electron supply layer 222 including recess 223. Alternatively, in nitride semiconductor device 301, 302, or 303, as in nitride semiconductor device 1 according to Embodiment 1, source opening 32 does not need to be provided.

(Planar Layout)

The planar layout of the nitride semiconductor device according to each of the embodiments described above will be described below. The planar layout described below can be applied to any one of the nitride semiconductor devices according to the embodiments described above and the variations thereof.

First Example

A first example of the planar layout will first be described with reference to FIGS. 14A and 14B.

Figure 14A:
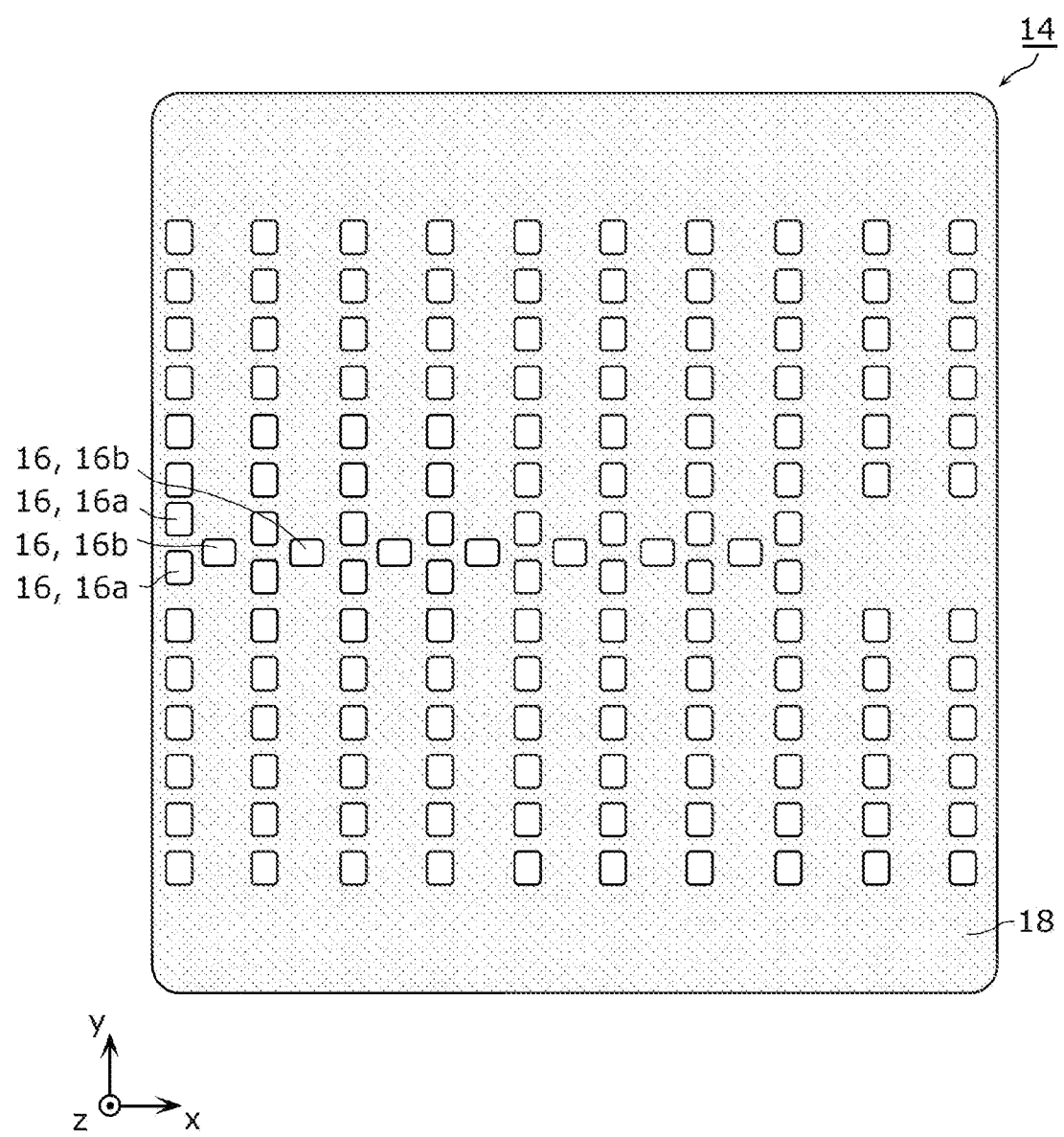
FIG. 14A is a plan view showing a first example of a layout of the current conducting portions and the current blocking portion of the nitride semiconductor device according to each of the embodiments.

FIG. 14A is a plan view showing the first example of the layout of current conducting portions 16 and current blocking portion 18 of the nitride semiconductor device according to each of the embodiments. FIG. 14B is a plan view showing a layout of source electrodes 28 and gate electrode 26 corresponding to the layout shown in FIG. 14A. A cross section taken along line I-I shown in FIG. 14B corresponds to the cross sections shown in the embodiments and the variations.

As shown in FIG. 14A, the nitride semiconductor device includes a plurality of current conducting portions 16. Current conducting portions 16 are arranged at regular intervals in plan view. The "at regular intervals" means that current conducting portions 16 are arranged with a predetermined regularity. For example, current conducting portions 16 are arranged at regular intervals along a predetermined direction.

In an example shown in FIG. 14A, current conducting portions 16 include a plurality of current conducting portions 16a and a plurality of current conducting portions 16b. Current conducting portions 16a are arranged at regular intervals along a y-axis direction (second direction). A plurality of columns of current conducting portions 16a arranged along the y-axis direction are arranged along an x-axis direction (first direction). In other words, current conducting portions 16a are arranged in a matrix on an xy plane.

Between each pair of adjacent columns of current conducting portions 16a, one current conducting portion 16b is provided. These current conducting portions 16b are arranged at regular intervals along the x-axis direction in the center of the y-axis direction.

Figure 14B:
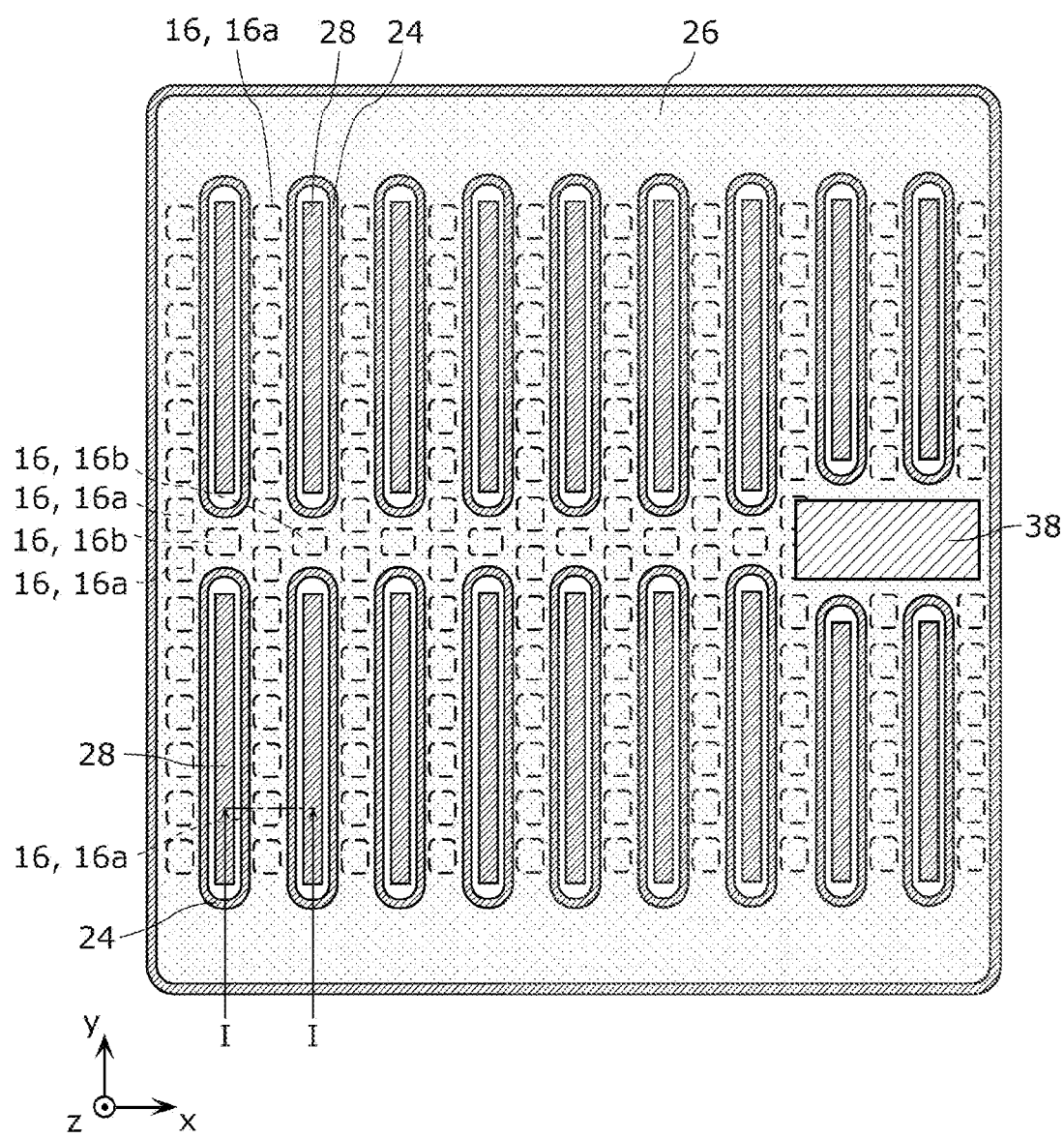
FIG. 14B is a plan view showing a layout of source electrodes and a gate electrode corresponding to the layout shown in FIG. 14A.

As shown in FIG. 14B, the nitride semiconductor device includes a plurality of source electrodes 28. When source openings 32 are provided, source opening 32 is provided in each of source electrodes 28.

Each of source electrodes 28 is in an elongated shape extending in the y-axis direction in plan view. Source electrodes 28 are sandwiched between pairs of current conducting portions 16a aligned along the x-axis direction. Specifically, each of source electrodes 28 is provided between a pair of columns of current conducting portions 16a aligned along the y-axis direction. Two source electrodes 28 are aligned along the y-axis direction, and current conducting portion 16a is disposed between two source electrodes 28.

Each of gate electrode 26 and threshold adjustment layer 24 is continuous to surround source electrodes 28. In other words, each of gate electrode 26 and threshold adjustment layer 24 is formed in an integral plate shape so as to cover substantially the entire surface of substrate 10, and openings for exposing source electrodes 28 are provided in only positions corresponding to source electrodes 28.

As shown in FIG. 14B, the nitride semiconductor device includes gate electrode pad 38. Gate electrode pad 38 is disposed above gate electrode 26 and is electrically connected to gate electrode 26. Gate electrode pad 38 is located at an end portion in the x-axis direction (third direction), and is located in a center portion in the y-axis direction (fourth direction).

Figure 15:
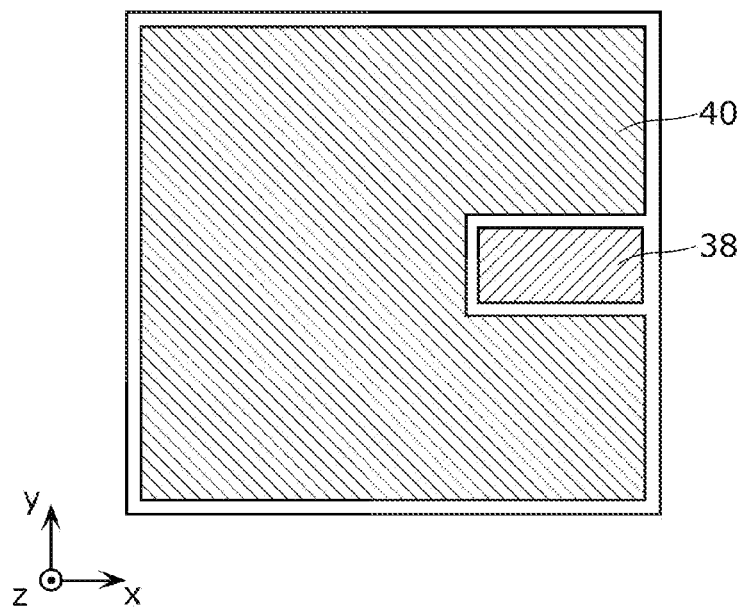
FIG. 15 is a plan view showing a first example of a layout of a gate electrode pad and a source electrode pad of the nitride semiconductor device according to each of the embodiments.

As shown in FIG. 15, the nitride semiconductor device includes source electrode pad 40 (which is not shown in FIG. 14B). FIG. 15 is a plan view showing a first example of a layout of gate electrode pad 38 and source electrode pad 40 of the nitride semiconductor device according to each of the embodiments.

Source electrode pad 40 is located above source electrodes 28, and is electrically connected to source electrodes 28. As shown in FIG. 15, source electrode pad 40 is provided in substantially the entire area other than gate electrode pad 38. In other words, source electrode pad 40 overlaps source electrodes 28 in plan view. Between source electrode pad 40 and source electrodes 28, an interlayer insulating film (not shown) which covers gate electrode 26 and threshold adjustment layer 24 is provided. In the interlayer insulating film, an opening for exposing at least a portion of each of source electrodes 28 is provided. Source electrode pad 40 and source electrodes 28 are electrically connected via the opening provided in the interlayer insulating film.

The shape of source electrode pad 40 is not limited to an example shown in FIG. 15. For example, source electrode pad 40 may be provided for each of source electrodes 28, and may be formed in the shape of comb teeth having finger portions (drawing wiring) extending along the y-axis direction. In this way, the overlap of source electrode pad 40 and gate electrodes 26 can be reduced, and thus it is possible to suppress the occurrence of a short circuit between the gate and the source.

Second Example

A second example of the planar layout will then be described with reference to FIGS. 16A and 16B.

Figure 16A:
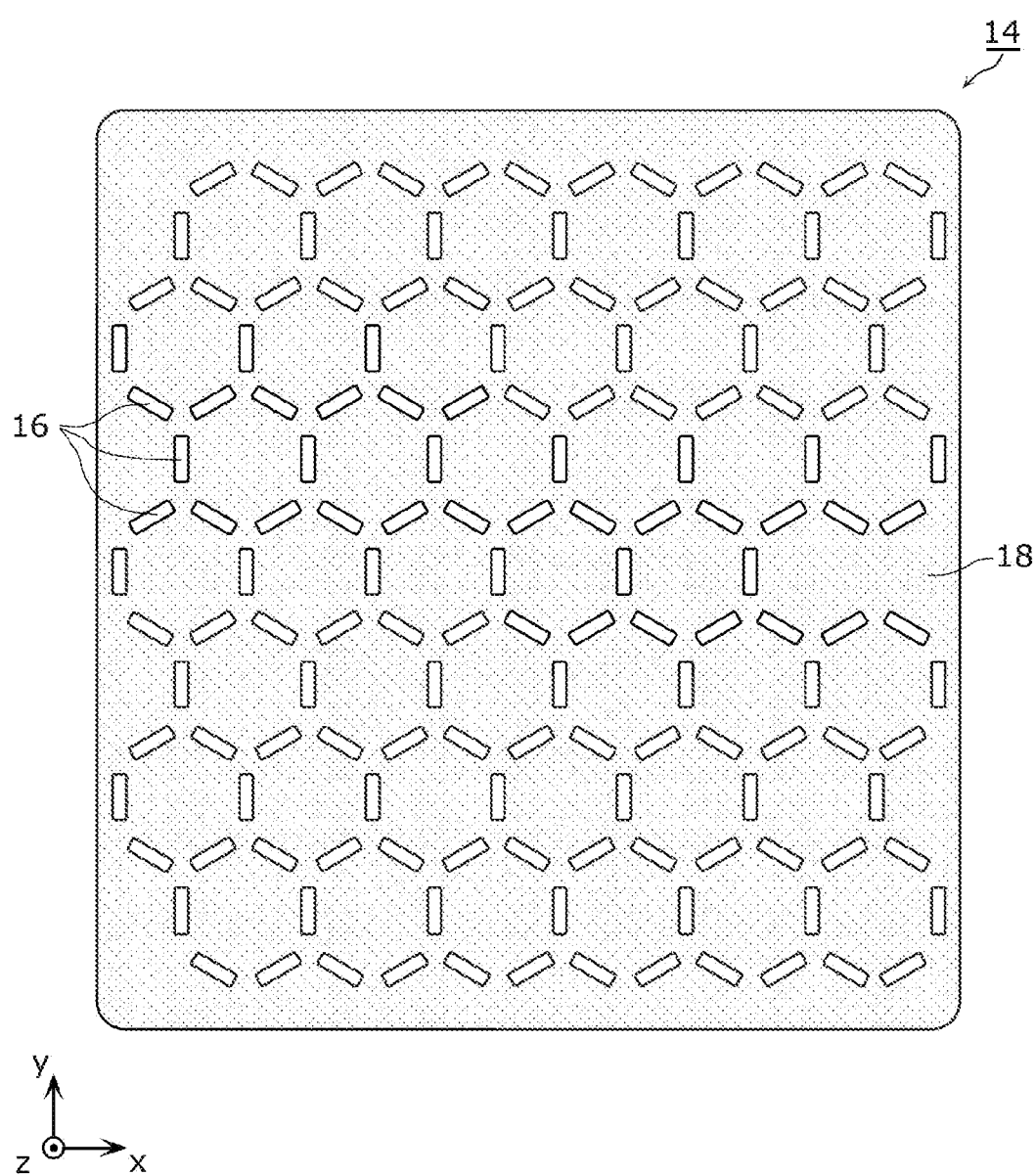
FIG. 16A is a plan view showing a second example of a layout of the current conducting portions and the current blocking portion of the nitride semiconductor device according to each of the embodiments.

FIG. 16A is a plan view showing a second example of a layout of current conducting portions 16 and current blocking portion 18 of the nitride semiconductor device according to each of the embodiments. FIG. 16B is a plan view showing a layout of source electrodes 28 and gate electrode 26 corresponding to the layout shown in FIG. 16A. A cross section taken along line I-I shown in FIG. 16B corresponds to the cross sections shown in the embodiments and the variations.

In an example shown in FIG. 16A, a plurality of current conducting portions 16 are arranged on sides of a plurality of virtual hexagons filled in a plane in plan view. Specifically, a plurality of current conducting portions 16 are provided in center portions of sides of a plurality of virtual regular hexagons filled in a plane so as to be elongated along the sides.

Figure 16B:
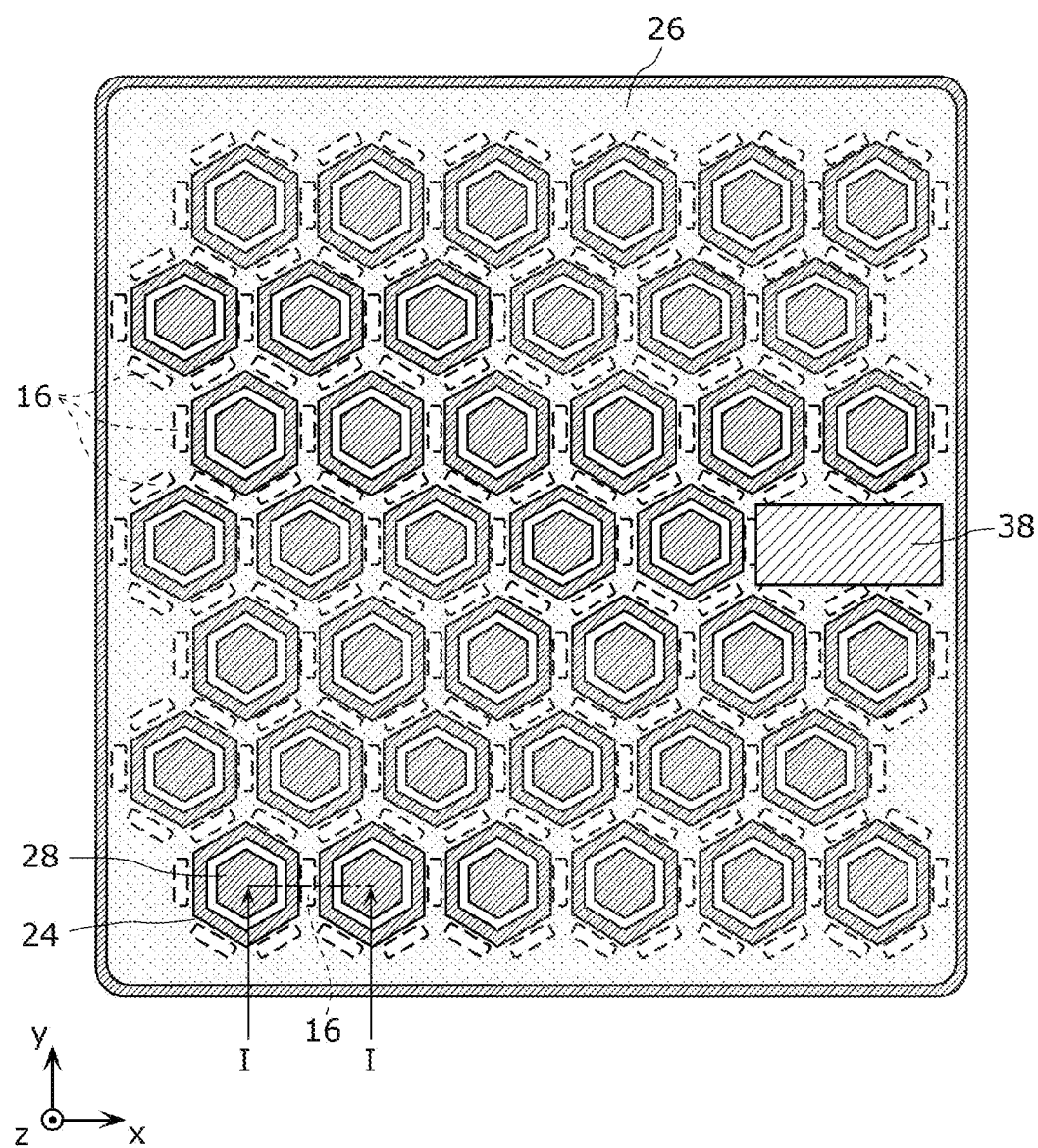
FIG. 16B is a plan view showing a layout of source electrodes and a gate electrode corresponding to the layout shown in FIG. 16A.

In an example shown in FIG. 16B, a plurality of source electrodes 28 each are arranged in center portions of the virtual hexagons filled in the plane. Although the shape of each of source electrodes 28 in plan view is a regular hexagon, the shape may be a circle. For each of source electrodes 28, six current conducting portions 16 are provided to surround corresponding source electrode 28.

In the example shown in FIG. 16B, each of gate electrode 26 and threshold adjustment layer 24 is continuous to surround source electrodes 28. In other words, each of gate electrode 26 and threshold adjustment layer 24 is formed in an integral plate shape so as to cover substantially the entire surface of substrate 10, and openings for exposing source electrodes 28 are provided in only positions corresponding to source electrodes 28. The shape of the opening is, for example, a regular hexagon.

As described above, in the example shown in FIGS. 16A and 16B, the nitride semiconductor device can have a closest-packed structure, and thus it is possible to sufficiently lower the on resistance per unit area.

[Variation of Electrode Pad]

Although in the layout described above, an example is shown where gate electrode pad 38 is disposed at the end portion, the present disclosure is not limited to this configuration.

Figure 17:
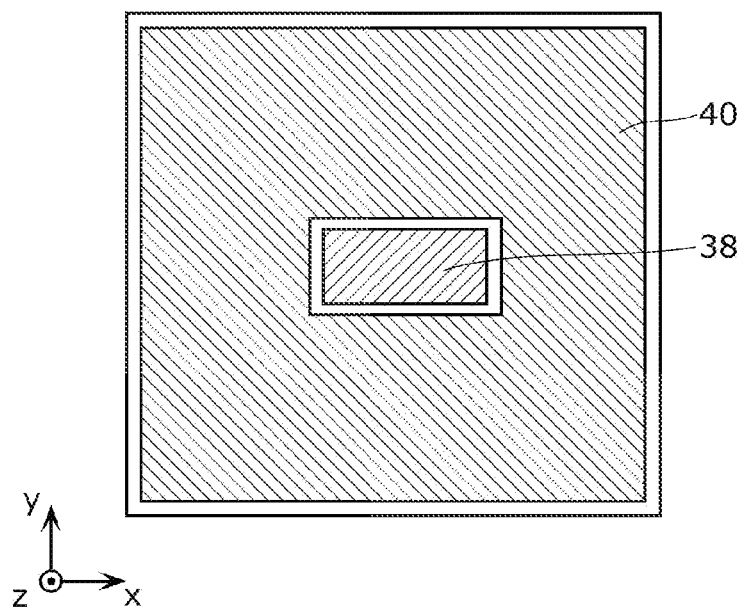
FIG. 17 is a plan view showing a second example of the layout of the gate electrode pad and the source electrode pad of the nitride semiconductor device according to each of the embodiments.

FIG. 17 is a plan view showing a second example of the layout of gate electrode pad 38 and source electrode pad 40 of the nitride semiconductor device according to each of the embodiments. As shown in FIG. 17, gate electrode pad 38 may be located in a center portion in each of the x-axis direction and the y-axis direction. In this way, gate electrode pad 38 is located in the center portion in the surface, and thus it is possible to uniformly apply a gate voltage to gate electrode 26.

Although here, an example is shown where the shape of gate electrode pad 38 in plan view is a rectangle which is elongated in the x-axis direction, the shape may be a square. The shape of gate electrode pad 38 in plan view may also be a rectangle which is elongated in the y-axis direction.

Gate electrode pad 38 may be disposed at an end portion in the y-axis direction or may be disposed at a corner of substrate 10 the shape of which is rectangular in plan view. The nitride semiconductor device may also include a plurality of gate electrode pads 38. For example, two gate electrode pads 38 may be disposed at an end portion on the positive side and at an end portion on the negative side in the x-axis direction or the y-axis direction.

[Guard Ring Region]

The structure of end portions of the nitride semiconductor device according to each of the embodiments and the variations will then be described with reference to FIGS. 18 and 19.

Figure 18:
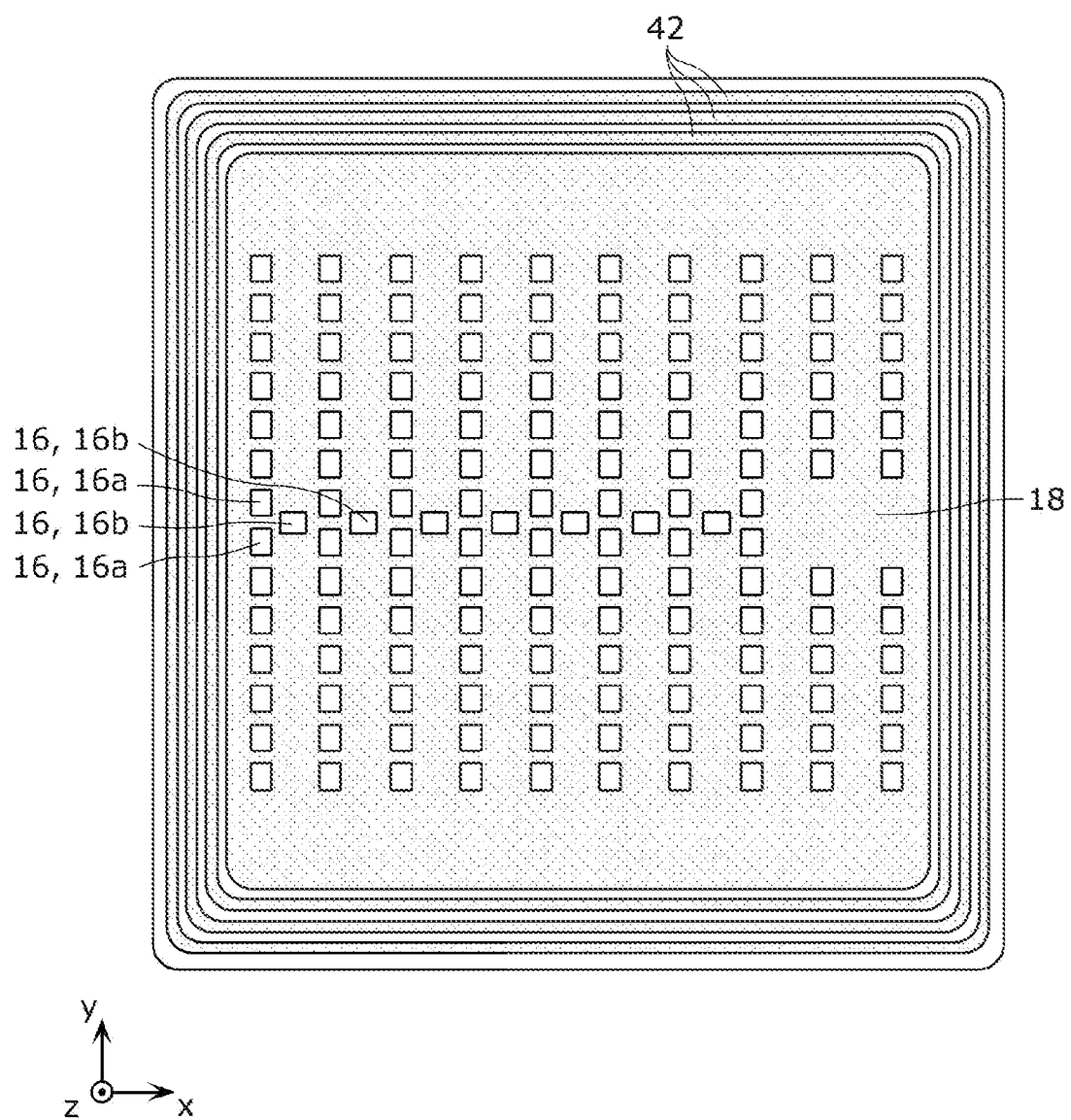
FIG. 18 is a plan view showing a variation of a layout of end portions of the nitride semiconductor device shown in FIG. 14A.
Figure 19:
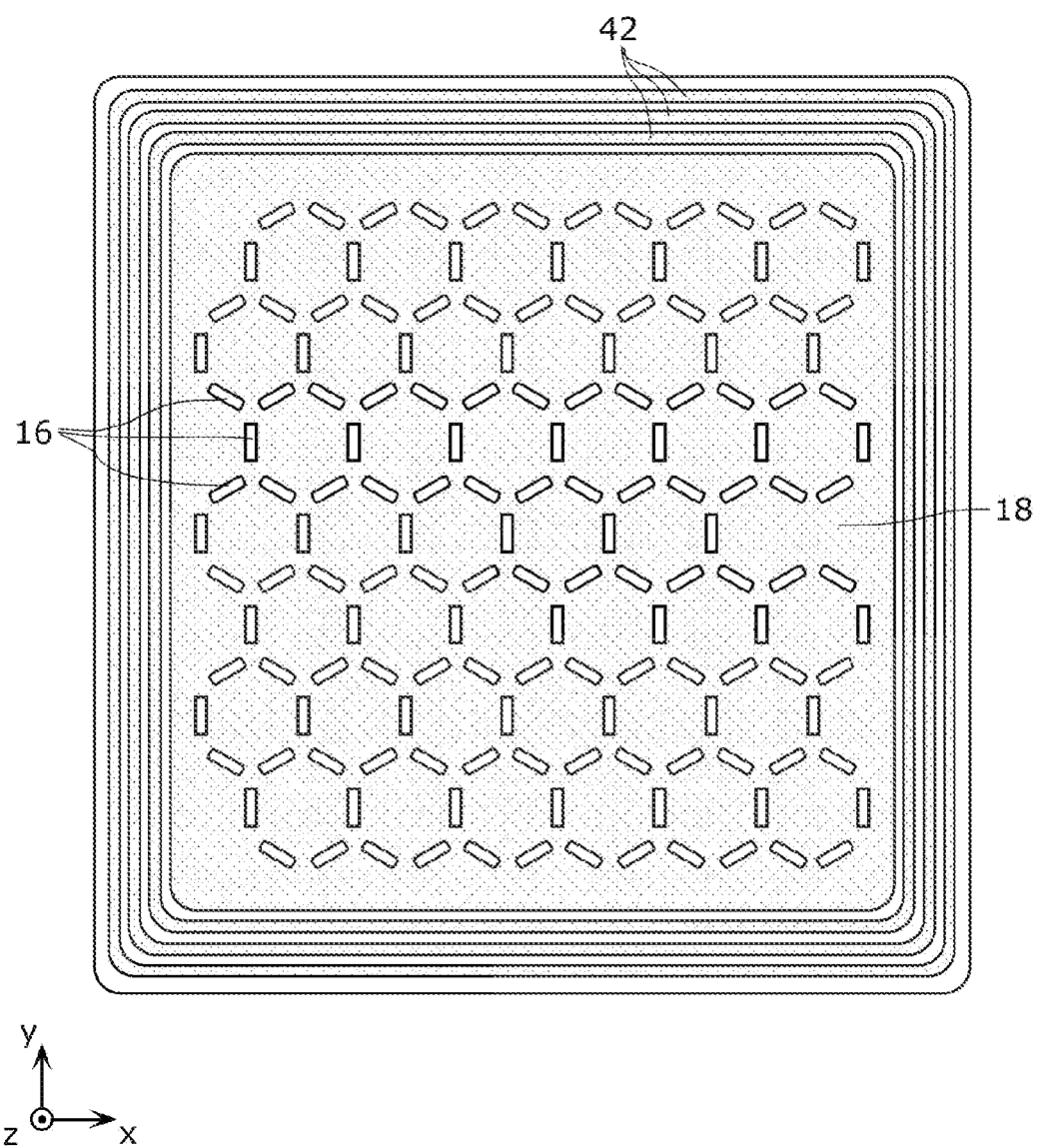
FIG. 19 is a plan view showing a variation of a layout of end portions of the nitride semiconductor device shown in FIG. 16A.

FIGS. 18 and 19 are respectively plan views showing variations of the layouts of end portions of the nitride semiconductor devices shown in FIGS. 14A and 16A. As shown in FIGS. 18 and 19, each of the nitride semiconductor devices includes a plurality of guard ring regions 42.

Each of guard ring regions 42 is a ring-shaped p type nitride semiconductor region which is arranged to surround current blocking portion 18 in plan view. Guard ring regions 42 are spaced a predetermined distance such that a guard ring which is located more outward has a larger ring. The distance between adjacent guard ring regions 42 is, for example, constant.

Guard ring regions 42 include a p type impurity (third impurity). The p type impurity included in guard ring regions 42 is the same as the p type impurity included in current blocking portion 18, and is specifically Mg. The p type impurity included in guard ring regions 42 may be different from the p type impurity included in current blocking portion 18.

Guard ring regions 42 each are located in the same layer as current blocking portion 18. For example, guard ring regions 42 are formed simultaneously with the formation of current conducting portions 16 and current blocking portion 18.

For example, when as shown in FIG. 4B, current blocking portion 18 is formed by ion-implanting Mg, as resist mask 90, a resist mask is used that is provided to cover not only a region in which current conducting portion 16 needs to be formed but also a region corresponding to an area between guard ring regions 42. This resist mask is utilized to ion-implant Mg, and thus current blocking portion 18 and guard ring regions 42 are formed simultaneously.

In this case, the concentration of the impurity of guard ring regions 42 is the same as the concentration of the impurity of current blocking portion 18. Specifically, the concentration of the impurity of guard ring regions 42 is distributed such that a peak is present in the thickness direction.

Alternatively, when as shown in FIG. 6B, current conducting portion 16 is formed by ion-implanting Si, as resist mask 91, a resist mask is used that is provided to cover not only a region in which current blocking portion 18 needs to be formed but also regions corresponding to guard ring regions 42. This resist mask is utilized to ion-implant Si, and thus p type nitride semiconductor film 14A is separated into ring shapes at termination portions in plan view, with the result that a plurality of guard ring regions 42 are formed.

In this case, the concentration of the impurity of guard ring regions 42 is the same as that of current blocking portion 18. Specifically, the concentration of the impurity of guard ring regions 42 is uniform in the thickness direction.

As described above, guard ring regions 42 are provided, and thus it is possible to relax electric field concentration at the termination portions of the nitride semiconductor device. The electric field concentration is relaxed, and thus it is possible to reduce the leakage current at the termination portions, with the result that the voltage resistance can be enhanced.

The planar layouts described above are only examples, and the present disclosure is not limited to these examples. In other words, the shapes, the numbers, and the arrangements of the current conducting portions are only examples, and can be changed as necessary. For example, in aperture structure layer 14, only one current conducting portion 16 may be provided.

Other Embodiments

Although the nitride semiconductor device according to one or a plurality of aspects has been described above based on the embodiments, the present disclosure is not limited to these embodiments. Embodiments obtained by performing, on the present embodiments, various variations conceived by a person skilled in the art and embodiments established by combining constituent elements in different embodiments are also included in the scope of the present disclosure as long as they do not depart from the spirit of the present disclosure.

For example, although the example is shown where current blocking portion 18 includes the nitride semiconductor of the second conductivity type, current blocking portion 18 may include an insulating nitride semiconductor. For example, current blocking portion 18 may be doped with carbon, iron, or the like.

For example, drift layer 12 may have a graded structure in which the impurity concentration (donor concentration) is gradually reduced from the side of substrate 10 to the side of aperture structure layer 14. The donor concentration may be controlled by Si which serves as a donor or may be controlled by carbon which serves as an acceptor for compensating for Si.

The first conductivity type may be the p type, the $p^+$ type, and the $p^-$ type, and the second conductivity type may be the n type, the $n^+$ type, and the $n^-$ type.

In the embodiments described above, various changes, replacements, additions, omissions and the like can be performed without departing from the scope of claims or the scope equivalent thereto.

INDUSTRIAL APPLICABILITY

The present disclosure can be utilized as a nitride semiconductor device in which electrical properties are improved, and can be utilized, for example, as a power transistor which is used in a power supply circuit of an xEV main inverter, an on-board charger, a general-purpose inverter for fuel cells or the like.

The invention claimed is:

1. A nitride semiconductor device comprising:
   a substrate;
   a first nitride semiconductor layer of a first conductivity type which is provided above the substrate;
   a second nitride semiconductor layer which is provided above the first nitride semiconductor layer;
   an electron transport layer and an electron supply layer which are sequentially provided above the second nitride semiconductor layer;
   a third nitride semiconductor layer of a second conductivity type and a gate electrode which are sequentially provided above the electron supply layer;
   a source electrode which has at least a portion provided on the electron supply layer; and
   a drain electrode which is provided on a side of the substrate opposite to a side on which the first nitride semiconductor layer is provided,
   wherein the second nitride semiconductor layer includes:
      a current conducting portion of the first conductivity type which is located below the third nitride semiconductor layer and includes a first impurity; and
      a current blocking portion which is provided about the current conducting portion, and
   a concentration of the first impurity in the electron transport layer is lower than a concentration of the first impurity in the current conducting portion.

2. The nitride semiconductor device according to claim 1, wherein the first impurity is silicon (Si).

3. The nitride semiconductor device according to claim 1, further comprising:
   an opening which penetrates through the electron supply layer and the electron transport layer to reach the current blocking portion,
   wherein the source electrode is provided along an inner surface of the opening.

4. The nitride semiconductor device according to claim 1, further comprising:

a fourth nitride semiconductor layer which is provided between the second nitride semiconductor layer and the first nitride semiconductor layer and is doped with carbon.

5. The nitride semiconductor device according to claim 4, wherein the fourth nitride semiconductor layer is provided in a region that overlaps only the current blocking portion out of the current conducting portion and the current blocking portion in plan view.

6. The nitride semiconductor device according to claim 1, wherein the current blocking portion includes a second impurity different from the first impurity,
a concentration of the second impurity in the current blocking portion is distributed such that a peak is present in a thickness direction of the second nitride semiconductor layer, and
the concentration of the first impurity in the current conducting portion is uniform in the thickness direction.

7. The nitride semiconductor device according to claim 1, wherein the current blocking portion includes a second impurity different from the first impurity,
the concentration of the first impurity in the current conducting portion is distributed such that a peak is present in a thickness direction of the second nitride semiconductor layer, and
a concentration of the second impurity in the current blocking portion is uniform in the thickness direction.

8. The nitride semiconductor device according to claim 6, wherein the second impurity is magnesium (Mg).

9. The nitride semiconductor device according to claim 1, wherein the electron supply layer includes a recess which is provided above the current conducting portion and below the third nitride semiconductor layer.

10. The nitride semiconductor device according to claim 1, further comprising:
a current diffusion layer which is provided between the first nitride semiconductor layer and the second nitride semiconductor layer and has a higher carrier concentration of the first conductivity type than the first nitride semiconductor layer.

11. The nitride semiconductor device according to claim 1,
wherein an interface between the current conducting portion and the current blocking portion is perpendicular to a main surface of the substrate.

12. The nitride semiconductor device according to claim 1,
wherein the current conducting portion is surrounded by the current blocking portion in plan view.

13. The nitride semiconductor device according to claim 12,
wherein the nitride semiconductor device comprises a plurality of current conducting portions each being the current conducting portion, and
the plurality of current conducting portions are arranged at regular intervals in plan view.

14. The nitride semiconductor device according to claim 13,
wherein the nitride semiconductor device comprises a plurality of source electrodes each being the source electrode,
the plurality of current conducting portions are arranged at regular intervals along a first direction and a second direction orthogonal to the first direction in plan view,
each of the plurality of source electrodes is in an elongated shape extending in the second direction in plan view, and is sandwiched between two current conduction portions aligned in the first direction, the two current conduction portions being included in the plurality of current conducting portions, and
the gate electrode is continuous to surround the plurality of source electrodes.

15. The nitride semiconductor device according to claim 13,
wherein the nitride semiconductor device comprises a plurality of source electrodes each being the source electrode,
the plurality of current conducting portions are arranged on sides of a plurality of virtual hexagons filled in a plane in plan view,
the plurality of source electrodes are individually arranged in center portions of the plurality of virtual hexagons, and
the gate electrode is continuous to surround the plurality of source electrodes.

16. The nitride semiconductor device according to claim 13, further comprising:
a gate electrode pad which is located above the gate electrode and is electrically connected to the gate electrode,
wherein the gate electrode pad is located at an end portion in a third direction and is located in a center portion in a fourth direction orthogonal to the third direction in plan view.

17. The nitride semiconductor device according to claim 13, further comprising:
a gate electrode pad which is located above the gate electrode and is electrically connected to the gate electrode,
wherein the gate electrode pad is located in a center portion in a third direction and is located in a center portion in a fourth direction orthogonal to the third direction in plan view.

18. The nitride semiconductor device according to claim 1, further comprising:
one or more nitride semiconductor regions of the second conductivity type which are ring-shaped and are arranged to surround the current blocking portion in plan view.

19. The nitride semiconductor device according to claim 18,
wherein each of the one or more nitride semiconductor regions includes a third impurity, and
a concentration of the third impurity in the nitride semiconductor region is distributed such that a peak is present in a thickness direction of the second nitride semiconductor layer.

20. The nitride semiconductor device according to claim 18,
wherein each of the one or more nitride semiconductor regions includes a third impurity, and
a concentration of the third impurity in the nitride semiconductor region is uniform in a thickness direction of the second nitride semiconductor layer.

* * * * *